(12) United States Patent
Butler

(10) Patent No.: US 7,209,219 B2
(45) Date of Patent: Apr. 24, 2007

(54) SYSTEM FOR CONTROLLING A POSITION OF A MASS

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 56 days.

(21) Appl. No.: 10/762,569

(22) Filed: Jan. 23, 2004

(65) Prior Publication Data

US 2004/0176861 A1   Sep. 9, 2004

(30) Foreign Application Priority Data

Mar. 6, 2003   (EP) .................................. 03075660

(51) Int. Cl.
  G03B 27/62   (2006.01)
  G03B 27/58   (2006.01)
  G03B 27/32   (2006.01)

(52) U.S. Cl. .............................. 355/75; 355/72; 355/77

(58) Field of Classification Search .................. 355/75, 355/53, 72; 250/548; 356/399, 400, 401; 360/78.07
See application file for complete search history.

(56) References Cited

U.S. PATENT DOCUMENTS

| | | | |
|---|---|---|---|
| 5,877,845 A | | 3/1999 | Makinouchi |
| 5,936,792 A | * | 8/1999 | Kobayashi et al. ...... 360/78.07 |
| 6,260,282 B1 | | 7/2001 | Yuan et al. |
| 2001/0029674 A1 | * | 10/2001 | Cutler ........................ 33/1 M |
| 2002/0145716 A1 | * | 10/2002 | Kurosawa ................... 355/55 |
| 2002/0145721 A1 | * | 10/2002 | Korenaga et al. ............. 355/75 |

FOREIGN PATENT DOCUMENTS

DE   43 29 484   3/1994

* cited by examiner

*Primary Examiner*—Peter B. Kim
(74) *Attorney, Agent, or Firm*—Pillsbury Winthrop Shaw Pittman LLP

(57) ABSTRACT

A control system for controlling a position of a mass, such as, for example, a substrate holder in a lithographic apparatus, is presented herein. The control system comprises a first input to receive a desired position of the mass, a second input signal to receive a feedback signal indicative of the actual position of the mass, a control unit that produces a signal indicative of the required control force based on the difference between the desired mass position and the actual mass position, and an estimator unit that calculates an estimated relation between the control force and mass status information indicative of at least one of a position of said mass, a velocity of said mass, and an acceleration of said mass, and a third input to receive a feed-forward signal indicative of the desired mass acceleration. The control system then determines the control force needed to accelerate the mass and move it to a desired position based on the estimated relation and the desired mass acceleration.

18 Claims, 24 Drawing Sheets

SYSTEM FOR CONTROLLING A POSITION OF A MASS

BACKGROUND OF THE INVENTION

1. Priority Documentation

This application claims priority from European Patent Application No. 03075660.5, filed Mar. 6, 2003, herein incorporated by reference in its entirety.

2. Field of the Invention

The present invention relates to a control system that controls a position of a mass, and in particular, to control a position of a moving component of a lithographic apparatus.

3. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist).

The term "patterning device" as employed herein should be broadly interpreted as referring to a mechanism that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

programmable mirror array: an example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth above.

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction. Because, typically, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, the pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Regarding the lithographic apparatus, a substrate table supporting a substrate is moved in an XY operating region by actuators controlled by a controller. It has been observed that the controller error behavior directly after accelerating to a constant velocity depends on the position of the substrate table in the XY operating region. It also depends on the exact mass that is to be moved, which varies due to, for example, variations in the mass of the substrate.

SUMMARY OF THE INVENTION

Principles of the present invention, as embodied and broadly described herein, provide for a controller configured to control a position of a mass by providing the mass a mass acceleration by a control force depending on a desired mass acceleration. The invention is especially applicable in controlling a position of a substrate table or a mask table in a lithographic apparatus. In one embodiment, controller is arranged to receive a feedback signal comprising status information of the mass, to calculate an estimated relation between the mass acceleration and said control force from said feedback signal and from said control force, and to use said estimated relation and said desired mass acceleration to determine said control force. Preferably, the status information comprises an indication of the position, the speed and/or the acceleration of the mass. In a particular embodiment the feedback signal is a feedback acceleration signal of the mass (the acceleration signal being measured or calculated).

In such a controller, feed-forward of the acceleration force adapts to position-dependent behavior and mass variations, and the controller error becomes smaller and less dependent on the position of the table in its operating region.

In an embodiment, the estimated relation may be an estimated mass. This embodiment is applicable where the mass is operating as a rigid body.

In an embodiment, the controller may be arranged to calculate at least one of an estimated velocity coefficient, an estimated jerk coefficient, and an estimated snap coefficient from the feedback position signal and the control force, with the aim of either creating a better estimate of the mass, and/or to use at least one of the estimated velocity coefficient, the estimated jerk coefficient, and the estimated snap coefficient to partly determine the control force. This may further improve the accuracy of the controller.

In another embodiment, the controller is arranged to calculate estimated filter coefficients of a general filter structure, such that the resulting filter describes the relation between the acceleration of the mass and the applied control force. The controller is further arranged to use the estimated filter coefficients and the desired mass acceleration to partly determine the control force.

In a further embodiment, the invention relates to a lithographic projection apparatus comprising a radiation system for providing a projection beam of radiation, a support structure for supporting patterning device, the patterning device serving to pattern the projection beam according to a desired pattern, a substrate table for holding a substrate, a projection system for projecting the patterned beam onto a target portion of the substrate, and a controller as defined above, the mass being a movable object in the lithographic apparatus.

The invention also relates to a method of controlling a position of a mass by providing the mass a mass acceleration by a control force depending on a desired mass acceleration characterized by receiving a feedback position signal indicating a position of the mass, calculating an estimated relation between the mass acceleration and the control force from the feedback position signal and from the control force and using the estimated relation and the desired mass acceleration to determine the control force.

In a further embodiment, the invention uses such a method in a device manufacturing method comprising providing a substrate that is at least partially covered by a layer of radiation-sensitive material, providing a projection beam of radiation using a radiation system, using patterning device to endow the projection beam with a pattern in its cross-section, projecting the patterned beam of radiation onto a target portion of the layer of radiation-sensitive material, and controlling a position of the mass, the mass being at least one of the substrate holder with the substrate and the support structure with the patterning device.

The projection system as described above usually comprises one or more, for instance six, projection devices, such as lenses and/or mirrors. The projection devices transmit the projection beam through the projection system and direct it to the target portion. In case the projection beam is EUV-radiation, mirrors should be used instead of lenses, in order to project the projection beam, since lenses are not translucent to EUV-radiation.

When an extreme ultraviolet projection beam is used for projecting relatively small patterns, the demands for the projection system concerning the accuracy are rather high. For instance, a mirror, that is positioned with a tilting error of 1 nm, can result in a projection error of approximately 4 nm on the wafer.

A projection system for projecting an extreme ultraviolet projection beam comprises, for instance, 6 mirrors. Usually, one of the mirrors has a fixed spatial orientation, while the other five are mounted on a Lorentz actuated mount. These mounts can preferably adjust the orientation of the mirrors in 6 degrees of freedom (6-DoF-mounts) using 6 degrees Lorentz engines per mirror. The projection system further comprises sensors for measuring the spatial orientation of the projection devices.

The projection system is mounted to the fixed world, for instance, a metro frame, using a 30 Hz mounting device. This is done to stabilize the projection beam and isolate it from vibrations and disturbances coming from the environment, such as adjacent systems. As a result of this mounting, unwanted disturbances above the 30 Hz are almost completely filtered out. However, disturbances having a frequency of approximately 30 Hz, are not stopped by the mounting device and are even amplified.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 12a shows the controller error with and without snap feed forward, whereas

FIG. 14a shows the controller error with and without snap feed-forward when using 10 Hz high-pass filters for the estimation, whereas

In the Figures, corresponding reference symbols indicate corresponding parts.

DETAILED DESCRIPTION

Figure 1:
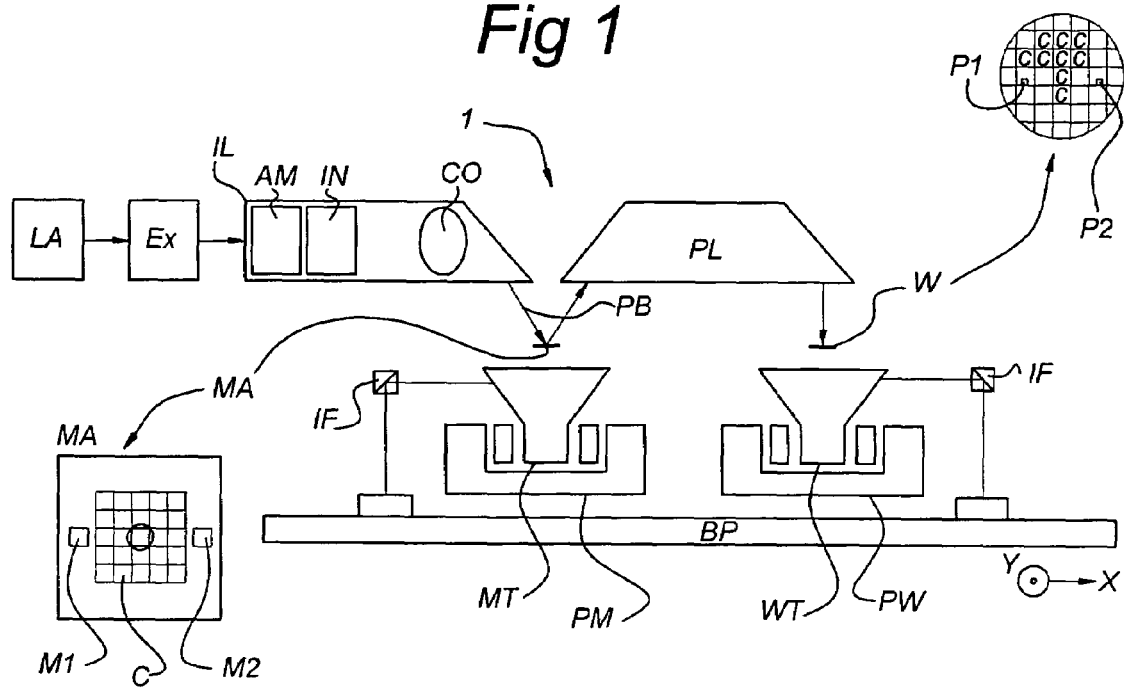
FIG. 1 is a schematic general overview of a lithographic projection apparatus.

FIG. 1 schematically depicts a lithographic projection apparatus according to a particular embodiment of the invention. The apparatus comprises:

a illumination system Ex, IL: for supplying a beam PB of radiation (e.g. EUV radiation with a wavelength of 11–14 nm). In this particular case, the radiation system also comprises a radiation source LA;

a first object table (mask table or holder) MT: provided with a mask holder for holding a mask MA (e.g. a reticle), and connected to first positioning mechanism PM for accurately positioning the mask with respect to item PL;

a second object table (substrate table or substrate holder) WT: provided with a substrate holder for holding a substrate W (e.g. a resist-coated silicon wafer), and connected to second positioning mechanism PW for accurately positioning the substrate with respect to item PL; and a projection system ("lens") PL: for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a laser-produced plasma or a discharge plasma EUV radiation source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1, that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning mechanism PW (and interferometric measuring means IF), the substrate table WT can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan.

In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in different modes:
step mode: the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;
scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution;
other mode: the mask table MT is kept essentially stationary holding a programmable patterning means, and the substrate table WT is moved or scanned while a pattern imparted to the projection beam is projected onto a target field C. In this mode, generally a pulsed radiation source is employed and the programmable patterning means is updated as required after each movement of the substrate table WT or in between successive radiation pulses during a scan. This mode of operation can be readily applied to maskless lithography that utilizes programmable patterning means, such as a programmable mirror array of a type as referred to above.

First Embodiment

Figure 2:
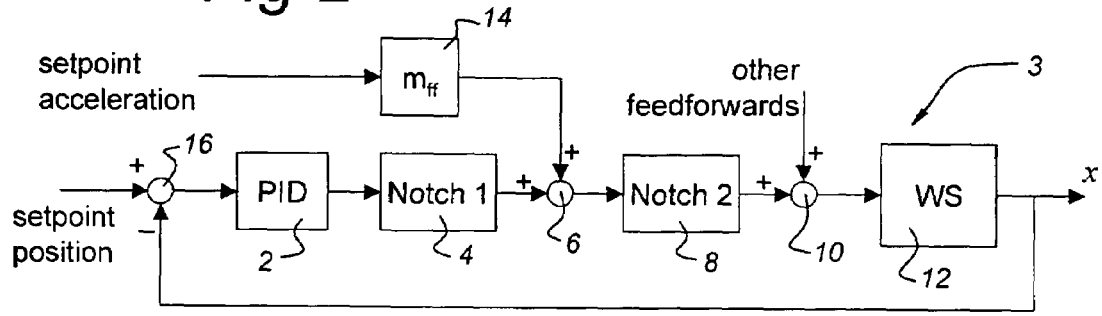
FIG. 2 shows a control architecture according to the state of the art.

The accuracy of positioning the mask and wafer stages is depends, in part, on the accuracy of the set point feed-forward. Currently, only a set point acceleration feed-forward using the (calibrated) mass is used, as depicted in FIG. 2. It is observed that FIG. 2 is a simplified picture, without decoupling, etc. Moreover, it is observed that, below, the invention will be illustrated with reference to the wafer stage (i.e., the wafer table WT, together with a wafer W), but it should be understood that the invention is equally applicable with the mask stage.

FIG. 2 shows a control system 3 for a wafer stage (WS) 12, as may be implemented by software in any type of computer arrangement (not shown) in the second positioning mechanism PW (FIG. 2). Such a computer arrangement may comprise a processor, a single computer, or a plurality of computers acting in co-operation. However, alternatively, any suitable type of analog and/or digital circuits may be used as well, as will be evident to persons skilled in the art. In that sense, FIG. 2 (and the other architecture Figures described here) only show functional modules that can be implemented in many different ways. Apart from the wafer stage 12, all of the components shown in FIG. 2, can be thought of as being included in the second positioning mechanism PW.

The control system 3 comprises a comparator 16 that receives a position set point signal for wafer stage 12 and an actual position signal from the wafer stage 12 that is fed back to the comparator 16. Based on the comparisons of the set point signal and the actual position signal, the comparator generates a positional track error signal that is output to a control unit 2, such as, for example, a Proportional-Integral-Derivative (PID) control unit.

PID control unit 2 is configured to provide a signal that is proportional to the force that will be applied to wafer stage 12 by the control system 3. The output of PID control unit 2 is connected to a first notch filter 4. The first notch filter 4 outputs a signal to a first adder unit 6 that has its output connected to a second notch filter 8. The first adder unit 6 also receives a force set point signal and adds this to the output of the first notch filter 4. The force set point signal is delivered as output signal from a multiplier unit 14 that multiplies a received acceleration set point signal by a mass $m_{ff}$, i.e., the feed-forward mass of the wafer stage 12. The use of mass $m_{ff}$ provides the ability of being able to move the wafer stage 12 from one position to another while minimizing the possibility of exacerbating the tracking positional error.

The second notch filter 8 has its output connected to a second adder unit 10. The second adder unit 10 can also receive additional feed-forward signals. The second adder unit 10 outputs the addition of its two input signals as a position control force to the wafer stage 12 to minimize the output of comparator 16 (the controller error).

It will be appreciated that the architecture of FIG. 2 is capable of controlling both a desired position of the wafer stage 12 and a translation to a new position via a controlled acceleration in an XY operating region of the wafer stage 12. While the set point acceleration equals the second derivative of the set point position, the feed-forward force generated by multiplier unit 14 results in a movement that already closely matches the set point position. The PID control unit 2 therefore only takes care of remaining deviations between the actual wafer stage path and that dictated by its set point position.

It has been observed that the controller error behavior (output of comparator 16) is dependent on the position of the wafer stage 12: the error is larger in the corners of the XY operating region. Note that a decoupling (gain balancing) matrix, that incorporates all gain effects like the mass, amplifier gain, motor constant (of an actuator, not shown, to translate the wafer stage 12), etc., is calibrated only in the centre of the operating region. The feed-forward mass $m_{ff}$, as depicted in FIG. 2, together with the accompanying delay correction, is also calibrated in the centre of the operating region.

One possible explanation of the position-dependent behavior lies in a changing 'gain' of the physical wafer stage 12, caused by one of the above-mentioned effects: mass, amplifier gain, motor force constant. Here, on-line mass estimation is proposed as a method to compensate for this effect. Besides position-dependence, other time-varying effects are countered as well, like ageing of components (amplifier, motor of actuator, etc.), or changed behavior due to heating of components (amplifiers, motors). Also, variations in the mass of the substrates that are subsequently exposed are countered.

The basic idea of on-line mass estimation is to continuously estimate the mass of the wafer stage 12 from the wafer stage input force and the resulting position change, i.e., from the output signals from the second adder unit 10 and the wafer stage 12. The estimated mass is used to modify the feed-forward coefficient $m_{ff}$ as used in the multiplier 14. If the estimation is fast enough, position-dependent behavior can be captured.

Note that not only the wafer stage mass is estimated but all aspects that influence the gain from the wafer stage input to its output are included in the estimation. Note also that, because only the feed-forward is adjusted, and the controller gain is left unchanged, the instability risk is minimized.

Figure 3:
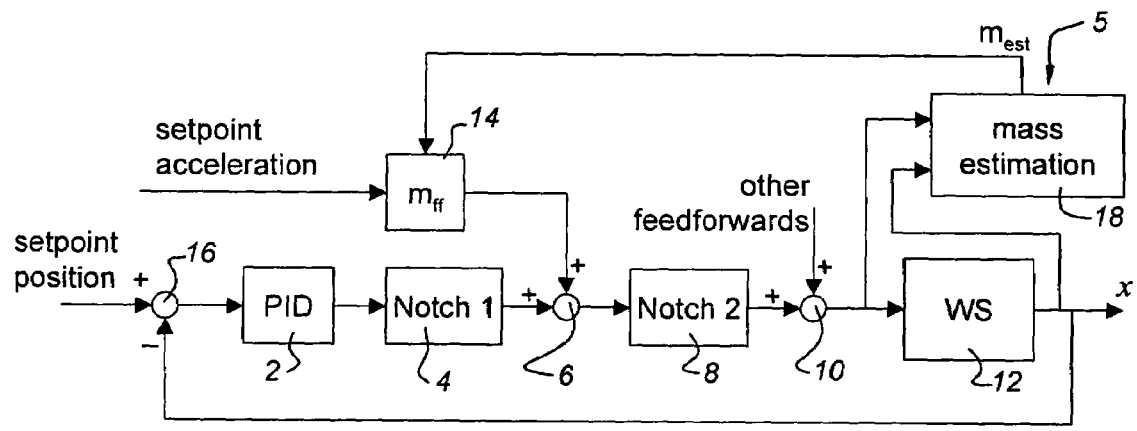
FIG. 3 shows a basic scheme for on-line mass estimation in accordance with the invention.

The basic architecture of the on-line estimation according to the invention is shown in FIG. 3. In FIG. 3, the same reference numerals as in FIG. 2 refer to the same components. In addition to FIG. 2, a mass estimation unit 18 is used that receives the output signals from the second adder unit 10 and the wafer stage 12 as input signals. From those input signals, it calculates a mass estimation signal $m_{est}$ that is output to the multiplier 14. The mass estimation unit 18 endeavors to estimate the actual mass of wafer stage 12 as different substrate wafers W may vary in weight. Also, the actual force required to move wafer stage 12 depends on characteristics of the amplifiers, actuators, etc., which may vary due to component aging.

It is observed that, below, it will be assumed that the mass estimation unit 18 receives an input signal as to position x directly from the wafer stage 12. However, alternatively, mass estimation unit 18 may receive input signals from the output of other units, e.g., comparator 16 or PID unit 2, to calculate the mass estimation $m_{est}$.

Now, the calculations made by the 'mass estimation' unit 18 will be explained. The main idea is to estimate the mass from the relation:

$$F = m \cdot a$$

The force F is generated by the controller, and is hence already available as output signal from second adder unit 10. The actual acceleration a, however, must be deducted from the actual position signal x received from the wafer stage 12, e.g., using a digital double differentiator 22 (FIG. 4):

$$a = \frac{(1-z^{-1})^2}{T_s^2} x$$

This double differentiator 22, however, suffers from 1 sample delay, which causes the force F to be one sample advanced with respect to acceleration a. For this reason, F must be delayed 1 sample as well. In addition, the force that is actuated will stay on an output of a Digital Analog Converter (not shown) for one sample, introducing another 0.5 sample delay. Further, the Input Output delay (calculation time of the motion controller computer) influences the time shift between the force and the acceleration. For this reason, the force must be delayed by a total of 2.35 samples (determined from measurements on an actual system). To that end, a delay unit 20 is introduced, see FIG. 4.

The least-squares method is used to estimate the mass. In general, the least-squares method estimates parameters of a model of which the output is linear in its parameters. In this case, the model simply generates the estimated force $\hat{F}$, which equals the measured acceleration multiplied by the estimated mass $\hat{m}$:

$$\hat{F} = \hat{m} \cdot a$$

The estimated force $\hat{F}$ is subtracted from the actual force F to generate an estimation error e:

$$e = F - \hat{F} = F - \hat{m} \cdot a$$

Figure 4:
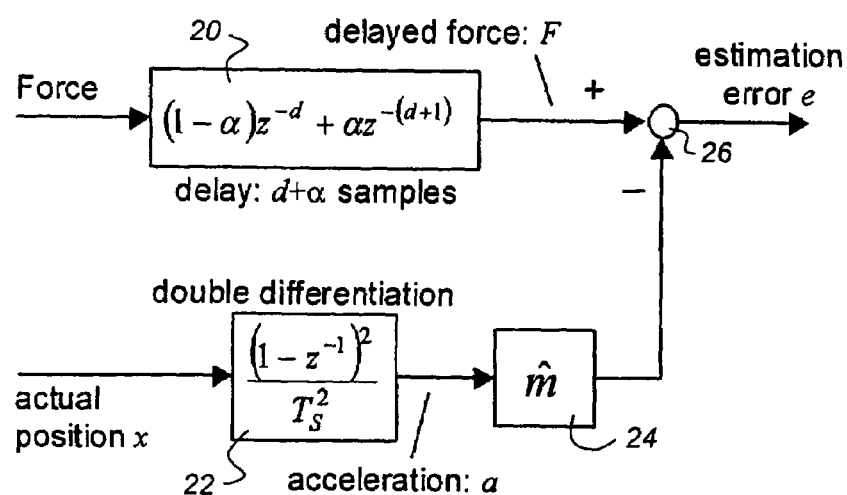
FIG. 4 shows a circuit for generation of an estimation error.

This estimation error e is one of the variables used by the least-squares method to create its mass estimation $\hat{m}$ (see following paragraph). The resulting block diagram is shown in FIG. 4 which shows the double differentiator 22 receiving the actual position signal from the wafer stage 12 and outputting acceleration a to a multiplier 24 that multiplies acceleration a by the estimated mass $\hat{m}$.

In general, the least-squares method is a method to estimate parameters from input/output data. Here, only the recursive least-squares method is described because at each sample, a new estimation must be generated. This is in contrast with the situation where all data is available beforehand, and an estimation has to be made only once.

A model output is generated that is the multiplication of a 'signal vector' ω and the previously estimated parameter vector $\hat{\theta}$:

$$\hat{y}(k) = \hat{\theta}^T(k-1)\omega(k).$$

The difference between the real output y(k) and the estimated output $\hat{y}(k)$ serves as estimation error: $e(k) = y(k) - \hat{y}(k)$. This estimation error e(k) is used to update the estimated parameter vector:

$$\hat{\theta}(k) = \hat{\theta}(k-1) + \Gamma(k)\omega(k)e(k)$$

Here, the 'adaptation gain matrix' Γ is updated every sample:

$$\Gamma(k) = \frac{1}{\lambda}\left[\Gamma(k-1) - \frac{\Gamma(k-1)\omega(k)\omega^T(k)\Gamma(k-1)}{\lambda + \omega^T(k)\Gamma(k-1)\omega(k)}\right]$$

where: λ="forgetting factor" (see further below)

In the case of the mass estimation discussed above, all of the above equations reduce to scalar equations:

$$y(k) = F(k)$$

$$\hat{y}(k) = \hat{m}(k-1)a(k)$$

$$\omega(k) = a(k)$$

$$\hat{\theta}(k) = \hat{m}(k)$$

$$e(k) = y(k) - \hat{y}(k) = F(k) - \hat{m}(k-1)a(k)$$

$$\begin{aligned}\Gamma(k) &= \frac{1}{\lambda}\left[\Gamma(k-1) - \frac{\Gamma(k-1)\omega(k)\omega^T(k)\Gamma(k-1)}{\lambda + \omega^T(k)\Gamma(k-1)\omega(k)}\right]\\ &= \frac{1}{\lambda}\left[\Gamma(k-1) - \frac{\Gamma^2(k-1)a^2(k)}{\lambda + \Gamma(k-1)a^2(k)}\right]\\ &= \frac{\Gamma(k-1)}{\lambda + a^2(k)\Gamma(k-1)}\end{aligned}$$

$$\hat{m}(k) = \hat{m}(k-1) + \Gamma(k)a(k)[F(k) - \hat{m}(k-1)a(k)]$$

Hence, in each sample, the following steps are taken:

Determine the current value of the signal vector $\omega(k)$. In the case of mass estimation, this equals the current value of the acceleration $a(k)$.

Determine the model output, based on the previous estimation of the parameter vector: $\hat{\theta}(k-1)$ and the current signal vector $\omega(k)$. In the case of the mass estimation, this equals the product of the previous mass estimate and the current value of the measured acceleration.

From the model output, and the actual output (in the case of the mass estimation: the current value of the force), the estimation error $e(k)$ can be calculated.

The adaptation gain matrix $\Gamma(k)$ is calculated using the above recursion equation. In the case of the mass estimation, where only one parameter is estimated, this is a scalar equation.

The parameter estimate is updated by using $\Gamma(k)$, $\omega(k)$ and $e(k)$. This produces a new mass estimate.

The parameter $\lambda$ denotes the 'forgetting factor'. If it is 1, the recursive least-squares method produces exactly the same output as the non-recursive version. This means that no parameter updates will be produced any more after a long period of time. To keep the method adapting the estimates, a value slightly below 1 should be chosen. In practice, a value of 0.995 appears to be fine. A larger value slows down the estimation, a smaller value introduces noise in the estimation.

Note that in the case of estimating other parameters than the mass, only the definition of the signal vector and the parameter vector need to be changed.

Note also that when more parameters are estimated, the numerical complexity increases quadratically because matrix calculations are involved.

A complication is the presence of offset on the control force. This is introduced by DACs, amplifiers, or even a tilted stone introducing a gravity component. While the acceleration is zero, still some force value is 'actuated'. If no other forces are present, the estimator interprets this effect as an infinite mass because the control force results in zero acceleration.

One possibility to tackle this is to estimate the offset as a second parameter. For this, the controller can be provided with an offset estimator which estimates the offset such that the estimated offset can for example subsequently be subtracted from the total mass estimation. However, this strategy may not work properly due to the excitation format (the acceleration profile has relatively long periods of constant acceleration), the least-squares method cannot properly distinguish between offset and mass. In other words, the offset estimation actually results in disturbance of the mass estimation.

Figure 5:
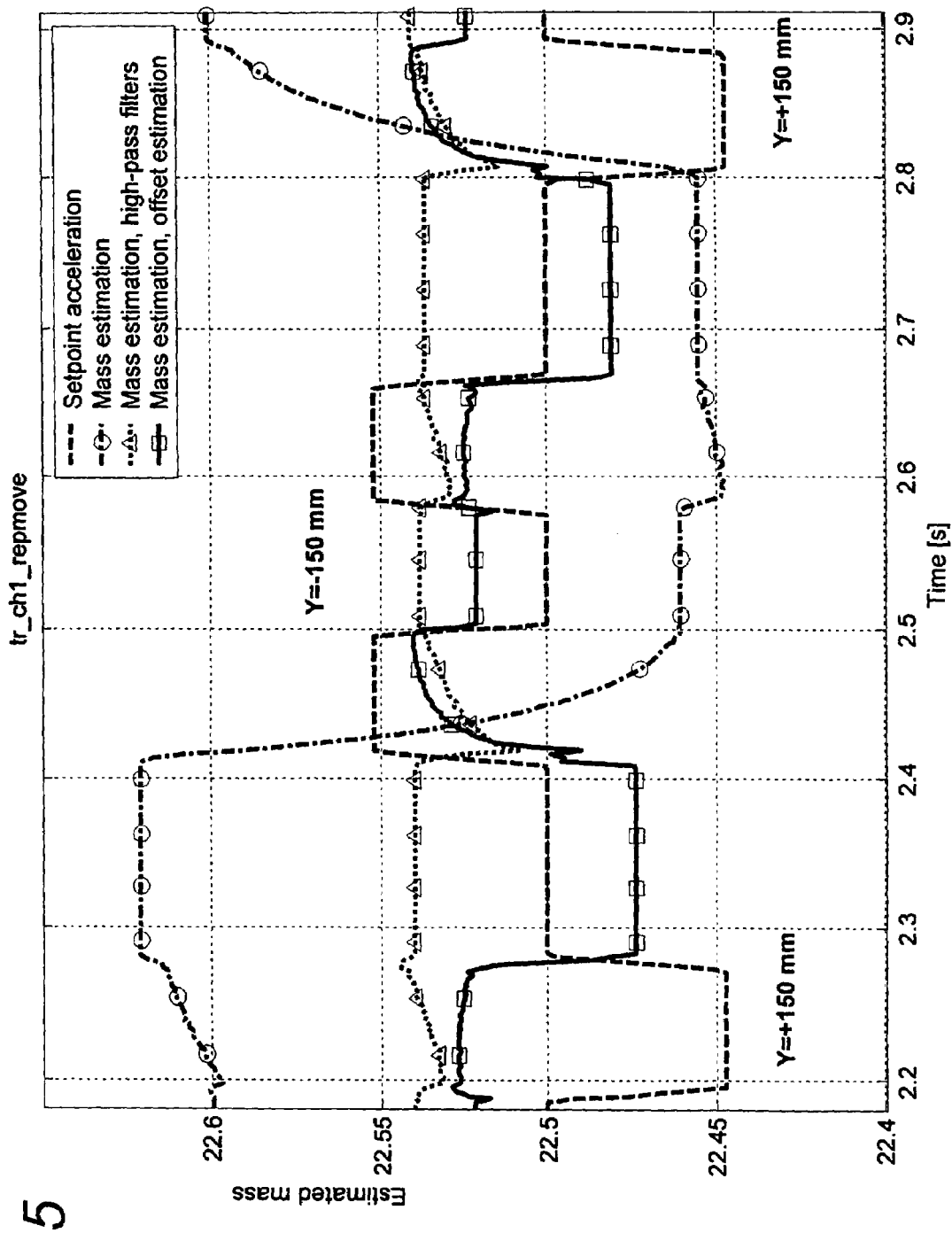
FIG. 5 shows several curves for mass estimation on a wafer stage. The curves include a set point acceleration curve, a mass estimation curve, a mass estimation curve using high-pass filters, and a mass estimation using an offset estimation.

For this reason, a simpler solution is chosen: both the actuated force and the acceleration are filtered by a high-pass filter. For a start, the time constant is set at 1 Hz. FIG. 5 shows the results of the mass estimation in the original situation, and the effects of either having an additional offset estimation or high-pass filters.

It can be seen that if the offset is not taken into account, the estimated mass at a position around y=+150 mm is approximately 22.62 kg, while the estimated mass at y=−150 mm is about 22.47 kg. This very large difference of 150 g is not visible any more if either the offset is estimated also, or the high-pass filters are used. However, the high-pass filter solution gets less disturbed in the 'jerk' phase of the set point, and is therefore preferable.

Figure 6:
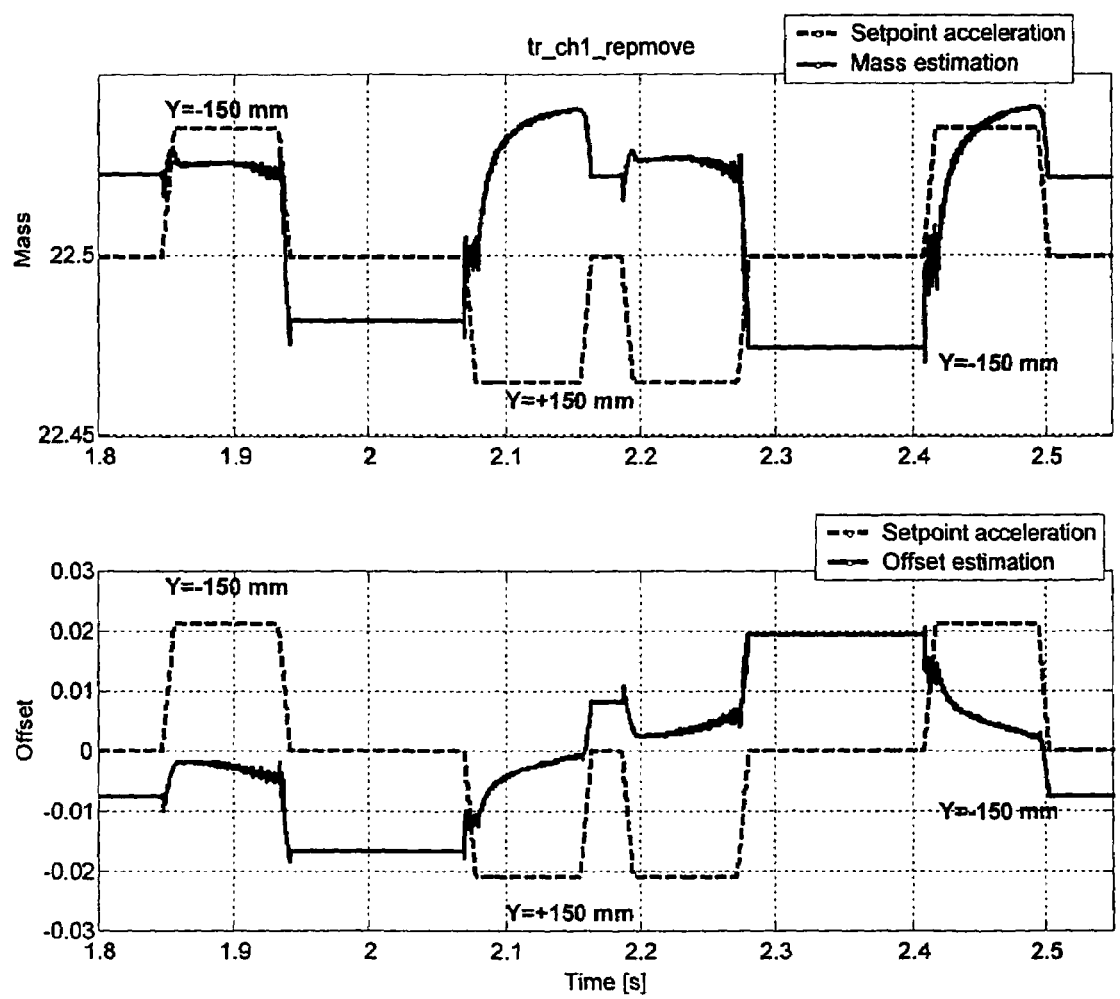
FIG. 6 shows an example of mass estimation and feed-forward.

FIG. 6 illustrates the mass and offset estimation as discussed above. It can be seen that, for example during the acceleration phase from 2.1 to 2.2 sec, both the mass and the offset are adjusted. This is caused by the fact that in the constant-acceleration region, the least-squares estimator cannot distinguish between an offset and a gain (both a higher offset and a higher mass could be the cause for a required higher force). This is a typical example of a too low 'persistent excitation', which more or less means that there is not enough frequency content in the signals to create a correct parameter update.

A similar problem exists during the constant-velocity phase, wherein the nominal controller force is zero, and so is the stage acceleration. In such a region, noise is the main contributor to the signal contents. The least-squares method reacts to such a condition by increasing its adaptation gain $\Gamma$. To avoid $\Gamma$ to get out of bound, adaptation is switched off when the set point acceleration becomes zero. Another alternative would be to limit the trace of $\Gamma$.

Note that the requirement on persistent excitation becomes more severe when the number of parameters increases (which, again, is clearly illustrated with the offset estimation example).

The previous paragraphs already showed some mass-estimation results. However, the estimated mass was not yet made active in the feed-forward path. This paragraph describes some results when the mass estimation is made active in the feed-forward.

Figure 7:
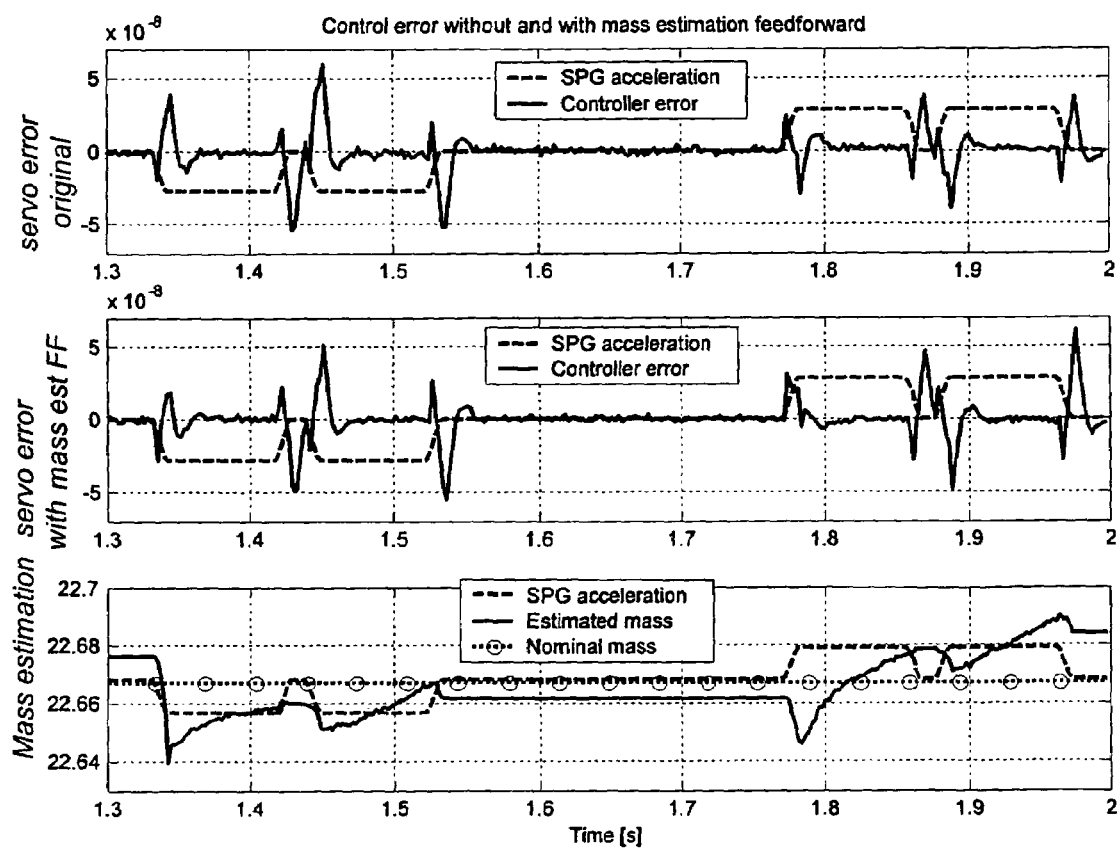
FIG. 7 shows curves for the control error without and with mass estimation feed-forward.

FIG. 7 shows an example, obtained by repeatedly moving the wafer stage in Y direction from −150 to +150 mm and back. The plots start with two negative acceleration phases: one to decelerate from +0.9 m/s to zero velocity, one to accelerate to −0.9 m/s. The end of the plot shows the deceleration to zero again, followed by acceleration to positive velocity. This implies that the 'left' side of the plot lies around +150 mm, while the right side of the plot is around −150 mm.

The top window of FIG. 7 shows the servo error without mass-estimation feed-forward. It can be seen that at the left side of the plot the peak error is about 62 nm, while at the right side the error is about 44 nm. Hence, the controller error is position-dependent, and is smaller at Y=−150 mm.

It can be seen that at the end of the $2^{nd}$ negative acceleration phase (around t=1.53 sec), the servo error obtained with and without mass-estimation feed-forward (middle window and upper window of FIG. 7, respectively) is the same. Strikingly, at this point the mass estimation roughly equals the nominal value (bottom window of FIG. 7). At the right side of the plot, the mass estimation increases during the two positive acceleration phases. It can be seen that also the servo error increases to the original value of 65 nm.

When further inspecting the plots of FIG. 7, it will be observed that the servo error is smaller when the estimated mass is smaller, and hence a smaller acceleration feed-forward is present. At the right side of the plot, it is advantageous to use the nominal value, because the mass estimation produces a 20 g higher mass feed-forward. In areas where the mass estimation is smaller than nominal, the servo error is smaller when using this estimated mass. The main conclusion here is that the usage of the nominal mass in the feed-forward is not optimal: a slightly smaller value improves the servo error.

Second Embodiment

The drift-like behavior in mass estimation during the acceleration phase could be caused by the fact that other disturbances influence the mass estimation. Candidates are, for example, the absence of velocity feed-forward in the control loop. Other candidates are jerk (derivative of acceleration) and snap (derivative of jerk) feed-forward. Because no compensation exists for disturbances in velocity, jerk and snap, the estimator 'pushes' all these effects into the mass estimation.

To check whether this is actually the case, combinations of estimations were tested using the input/output traces as discussed above:

Mass estimation only

Estimation of mass and velocity feed-forward

Estimation of mass, velocity and jerk feed-forward

Estimation of mass, velocity, jerk and snap feed-forward

Figure 8:
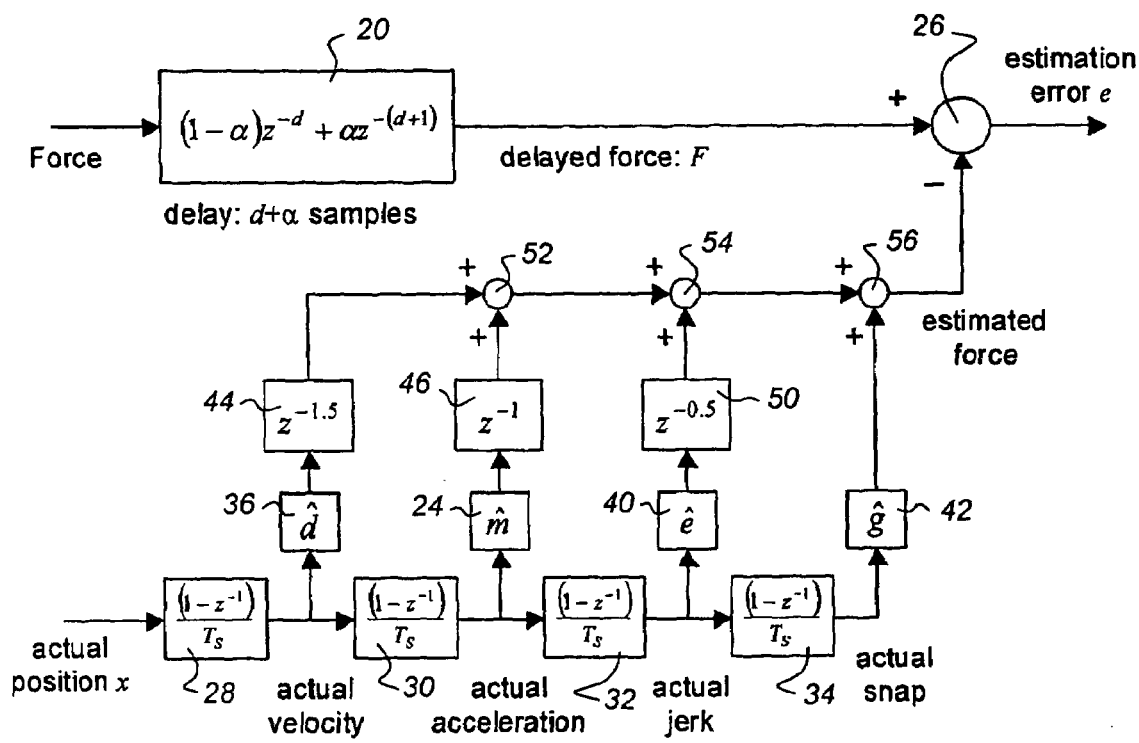
FIG. 8 shows a circuit that can be used to estimate velocity, acceleration, jerk and snap feed-forward.

To be able to estimate more parameters, the signal vector and parameter vector need to be extended. For this purpose, jerk, snap and velocity must be created by gradual differentiation of the position of the wafer stage 12. Because each digital differentiation introduces 0.5 samples delay, the various signals must be delayed such that at the end they all have the same delay. The delay in the force signal must match this total delay. FIG. 8 shows the creation of the signal vector and the place of the respective parameters d, m, e and g, where:

d=a velocity coefficient;

m=mass;

e=a jerk coefficient;

g=a snap coefficient.

FIG. 8 shows a first differentiator 28, a second differentiator 30, a third differentiator 32, and a fourth differentiator 34 connected in series. An actual position signal is received from the wafer stage 12 and input to the first differentiator 28. Thus, an actual velocity signal, an actual acceleration signal, an actual jerk signal and an actual snap signal, respectively, are present at the outputs of the first differentiator 28, the second differentiator 30, the third differentiator 32, and the fourth differentiator 34, respectively. The actual velocity signal is multiplied by estimated velocity coefficient d̂ in multiplier 36 and then delayed by 1,5 time period by a delay unit 44. The actual acceleration signal is multiplied by estimated mass m̂ in multiplier 24 and then delayed by one time period by a delay unit 46. The actual jerk signal is multiplied by estimated jerk coefficient ê in multiplier 40 and delayed by 0,5 time period by a delay unit 50. The actual snap signal is multiplied by estimated snap coefficient ĝ in multiplier 42. The outputs of the delay units 44, 46, 50 and of the multiplier 42 are shown to be added by adder units 52, 54, 56 to render an estimated force signal to subtraction unit 26.

Note that the estimated parameters need not all be used in the feed-forward, but could have the only goal of making the mass estimation more stable.

The fact that jerk and snap feed-forwards could be required stems from the fact that the process is not only represented by a mass but also has higher-order dynamics. A first possibility is that the process is described by a mass plus one resonance frequency, yielding the following equation for a movement x of the wafer stage 12 as a reaction to a force F:

$$\frac{x}{F} = \frac{1}{ms^2} \frac{1}{(g/m)s^2 + (e/m)s + 1} = \frac{1}{gs^4 + es^3 + ms^2}$$

Adding a friction term yields:

$$\frac{x}{F} = \frac{1}{gs^4 + es^3 + ms^2 + ds}$$

The correct feed-forward for such a process would look like:

$$F = (gs^4 + es^3 + ms^2 + ds)x_{SPG}$$

Where: $x_{SPG}$= the set point position as generated by the set point position generator.

In addition to the acceleration feed-forward ($ms^2$), the velocity (ds), jerk ($es^3$) and snap ($gs^4$) feed-forwards are clearly recognised.

Figure 9:
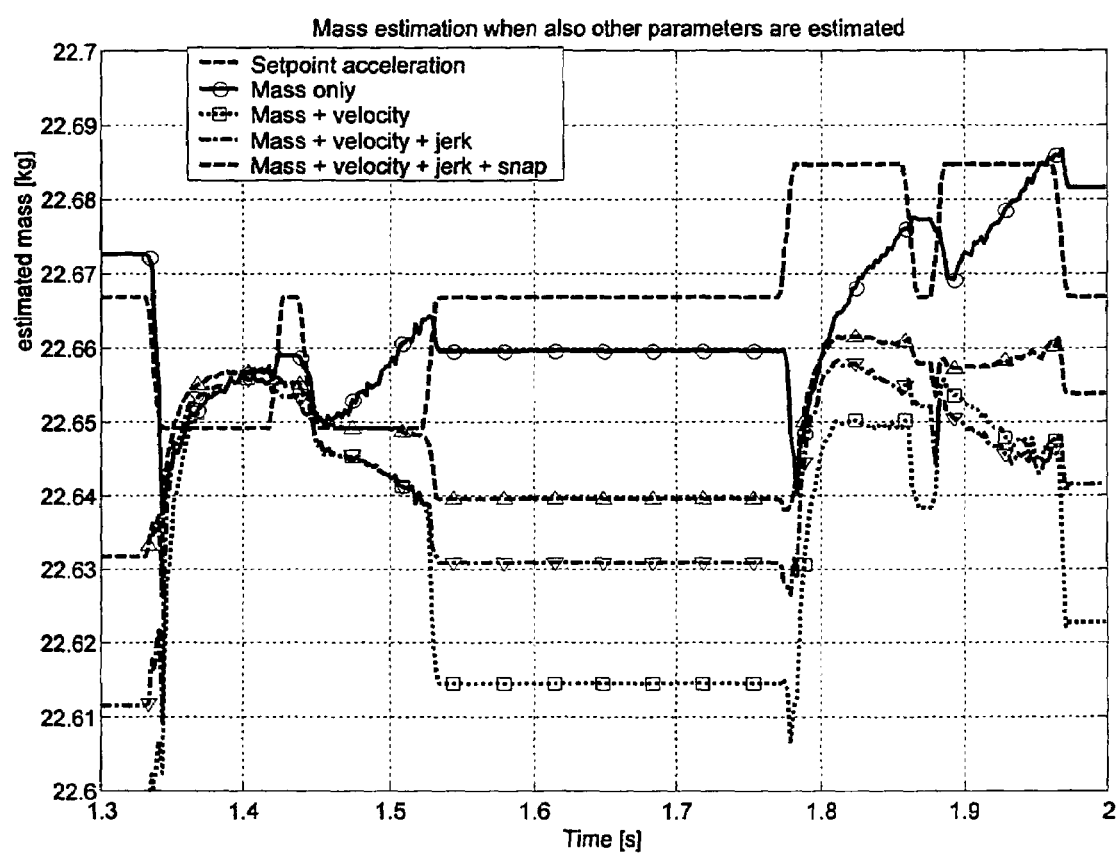
FIG. 9 shows curves for mass estimation when various other parameters are estimated.

FIG. 9 shows the mass estimation result under the conditions mentioned above. When only the mass m is estimated, the typical rise in mass during the acceleration phase is observed. If the velocity coefficient d is adjusted as well, the mass estimation becomes somewhat more stable. The mass estimation now drifts downwards during the acceleration. When, additionally, the jerk coefficient e is estimated, this result does not change significantly. However, when also the snap coefficient g is estimated, the mass estimation becomes the most stable.

Figure 10:
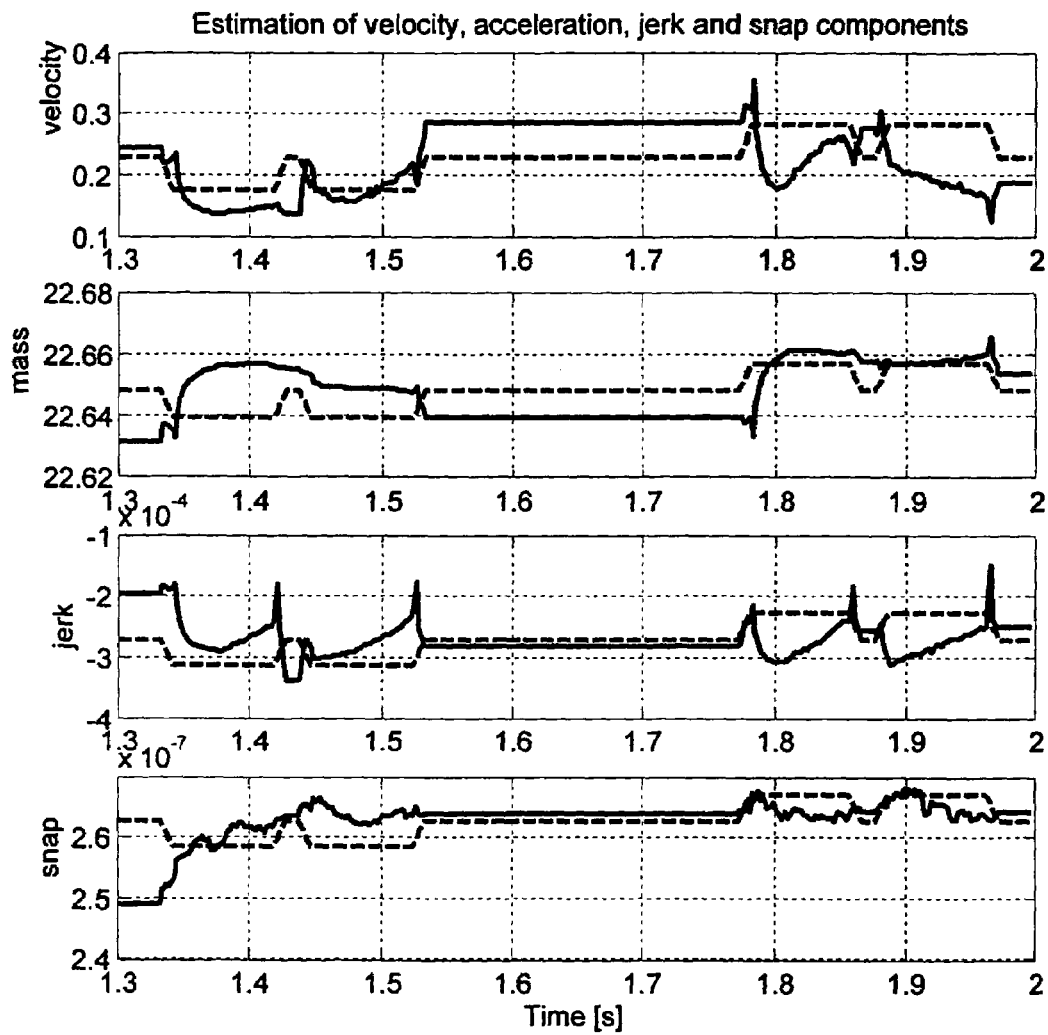
FIG. 10 shows curves for estimations of velocity, acceleration, jerk and snap components.

FIG. 10 shows the estimation of all four parameters. It can be seen that especially the snap adjusts stably to 2.7e−7 Ns$^3$/m, but the other parameters are 'disturbed' during the jerk phase. Also, the jerk coefficient was expected to be zero because no time lag between the measured acceleration and force should be present any more (a jerk coefficient means that a constant force is required during the jerk phase, which is also the case when the acceleration feed-forward timing is not correct; hence the presence of jerk feed-forward indicates a timing problem).

Now, a test was performed, as follows. In three different X positions (−150 mm, 0, +150 mm), repeated Y-movements of +/−150 mm were performed during each acceleration/deceleration part, the estimated mass (when using the combined velocity/mass/jerk/snap estimation as described above) is recorded by using the average of the last 100 points (20 msec) at the end of each acceleration/deceleration part (hence, before the jerk phase starts!). This yields an 'estimated mass' at six points within the wafer stage field. The estimated mass is summarized in the following tables. Note that the nominal mass, as calibrated in the feed-forward calibration, equals 22.667 kg.

TABLE 1

Estimated Mass When Velocity, Acceleration, Jerk & Snap Feed-Forwards Are Also Estimated

| | X | | |
|---|---|---|---|
| Y | −150 mm | 0 | +150 mm |
| −150 mm | 22.662 | 22.654 | 22.657 |
| +150 mm | 22.682 | 22.675 | 22.675 |

TABLE 2

Estimated Mass When Only The Mass Is Estimated

| | X | | |
|---|---|---|---|
| Y | −150 mm | 0 | +150 mm |
| −150 mm | 22.674 | 22.667 | 22.666 |
| +150 mm | 22.696 | 22.688 | 22.688 |

In all X positions, the controller error varies between 40 and 60 nm when no feed-forward adjustment is performed. The error is 60 nm in all positions when feed-forward mass estimation is switched on. In Table 2 it can be seen that at the positions where the servo error is the same, the estimated mass matches the nominal mass. In the locations where the servo error is smaller when no feed-forward adjustment takes place, the estimated mass is higher, and hence the original feed-forward is actually smaller than required. Evidently, a slightly (20 g) too small acceleration feed-forward by itself reduces the servo error.

Third Embodiment

Estimating many parameters simultaneously may not be the perfect solution for all situations for various reasons:

Matrix calculations (Γ!) become complicated and use a lot of calculation time.

The excitation must be persistent enough, which differs with the signal type: the mass (=acceleration feed-forward) should be estimated only when the acceleration is sufficiently large, therefore the estimation is switched off when the acceleration set point is smaller than some value. However, the jerk feed-forward estimation requires a sufficient jerk, the snap estimation requires a sufficient snap, and the velocity feed-forward estimation requires a sufficient velocity. Hence, the estimation of the different parameters should be switched on during different phases of the trajectory, which is impossible when using the least-squares method.

Not all parameters may be time-varying, focus should be placed on those parameters that change.

Figure 11:
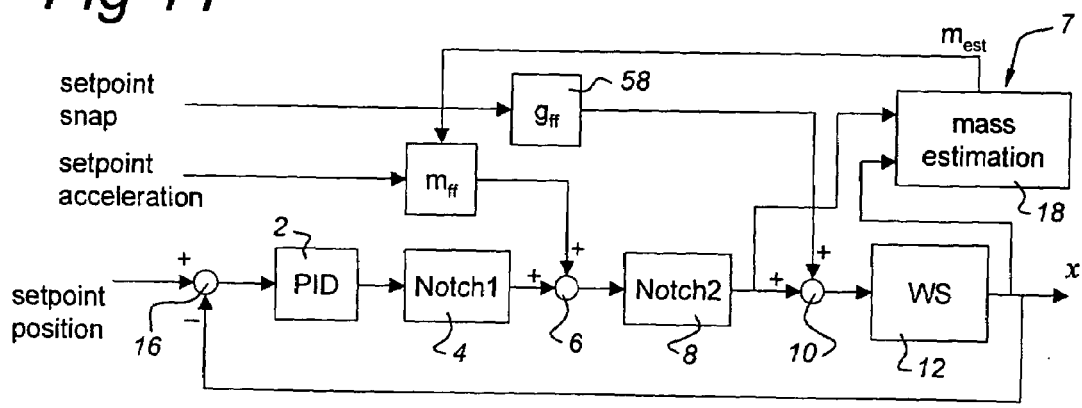
FIG. 11 shows a feed forward circuit for mass estimation and snap feed-forward.

On the other hand, as observed in the previous paragraphs, the mass estimation appears to be disturbed by the fact that the process not only consists of a mass but also includes higher-order dynamics (hence the estimation of the other 3 parameters). Assuming the snap feed-forward takes away the higher-order dynamics from the mechanics, the mass estimator should now be connected to the control force minus the snap component, as shown in FIG. 11 where the adder 10 receives a further input signal from a multiplier 58. The multiplier 58 multiplies a received snap set point signal by a feed-forward snap coefficient $g_{ff}$. The mass estimation block 18 now receives a force signal from the output of Notch 2 block 8, i.e. excluding the snap feed-forward component from multiplier 58. Because the snap feed-forward compensates the higher dynamics of the wafer stage, the relation between stage acceleration and the output of Notch 2 better resembles a mass.

Figure 12B:
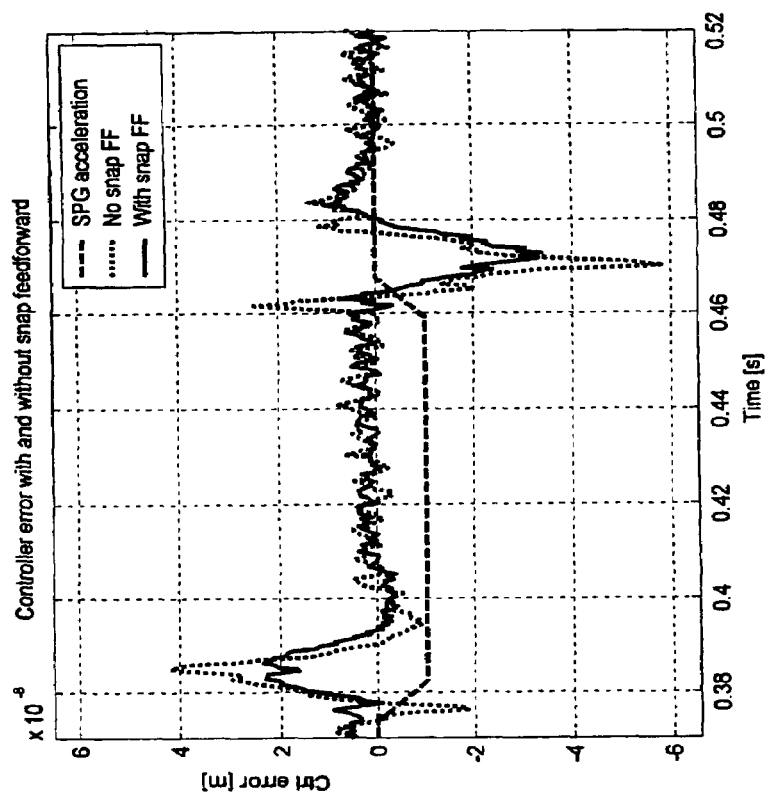
FIG. 12b shows a portion of FIG. 12a on an enlarged time scale.
Figure 12A:
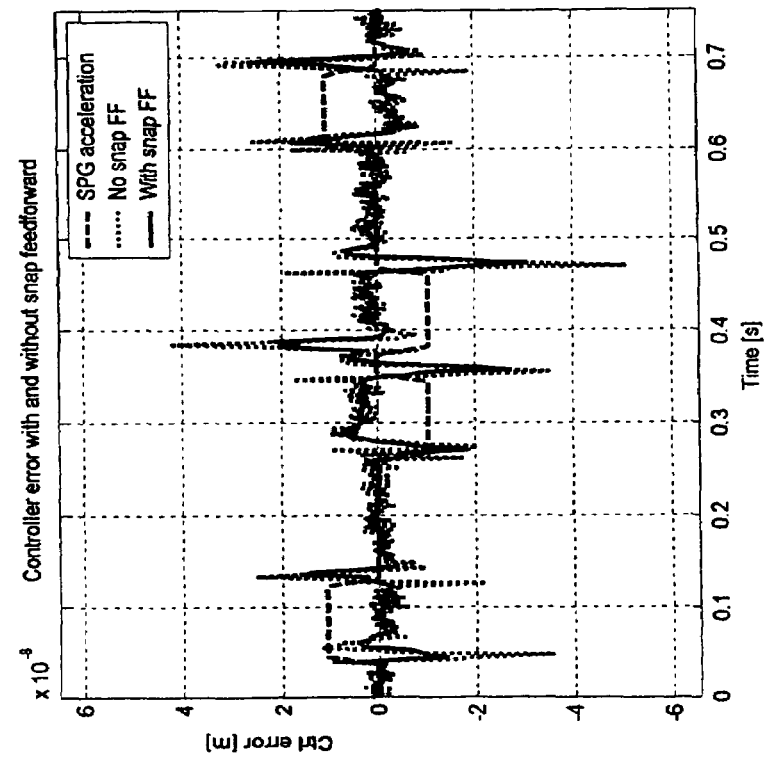
Figure 13:
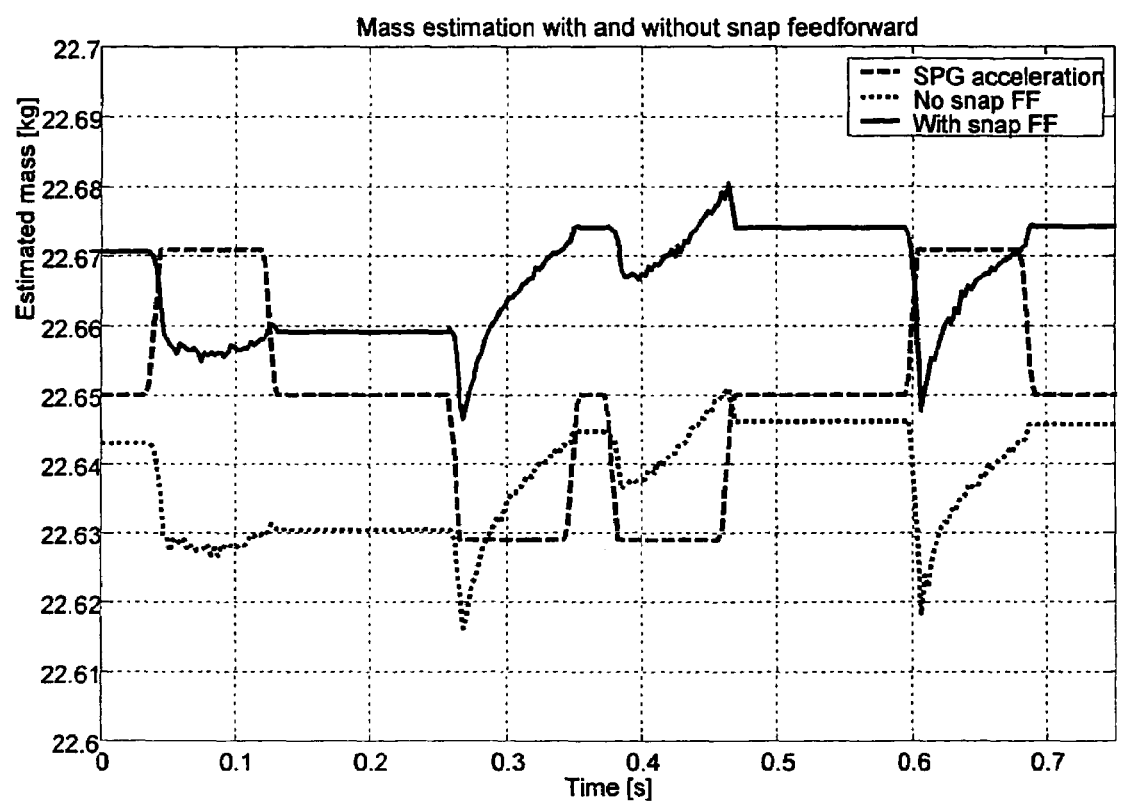
FIG. 13 shows mass estimation with and without snap feed-forward.

The following plots show preliminary results. FIG. 12 shows the controller error without and with snap feed-forward, while the mass estimation is switched on. This mass estimation is shown in FIG. 13.

It can be seen that the mass estimation is not influenced by the presence of snap feed-forward. The snap feed-forward in this particular test by itself reduces the servo error about a factor of 2 (from 60 to 30 nm peak).

Figure 14B:
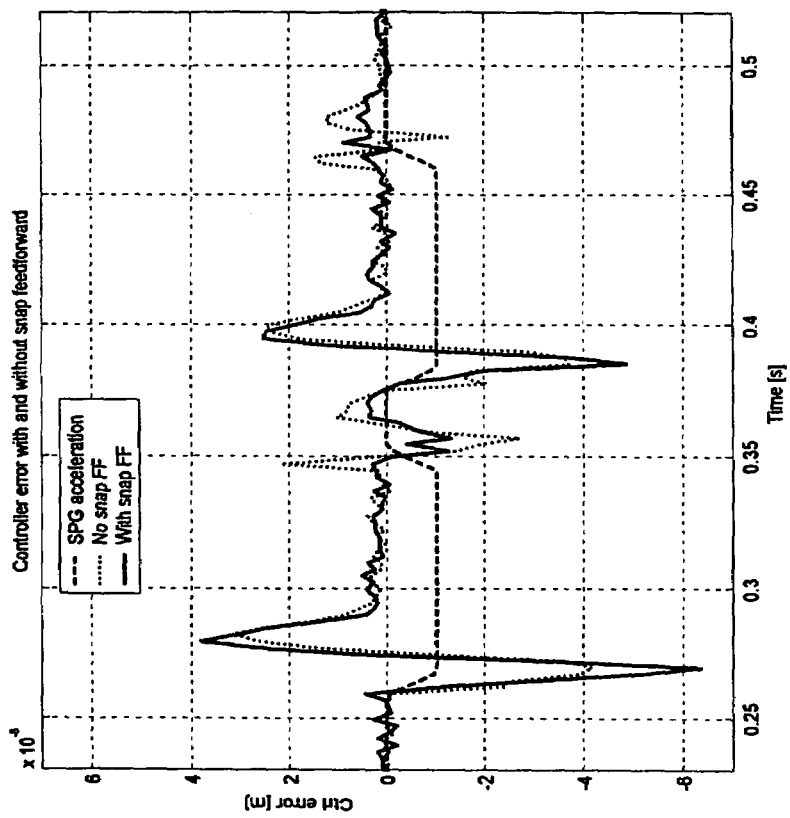
FIG. 14b shows a portion of FIG. 14a on an enlarged time scale.
Figure 14A:
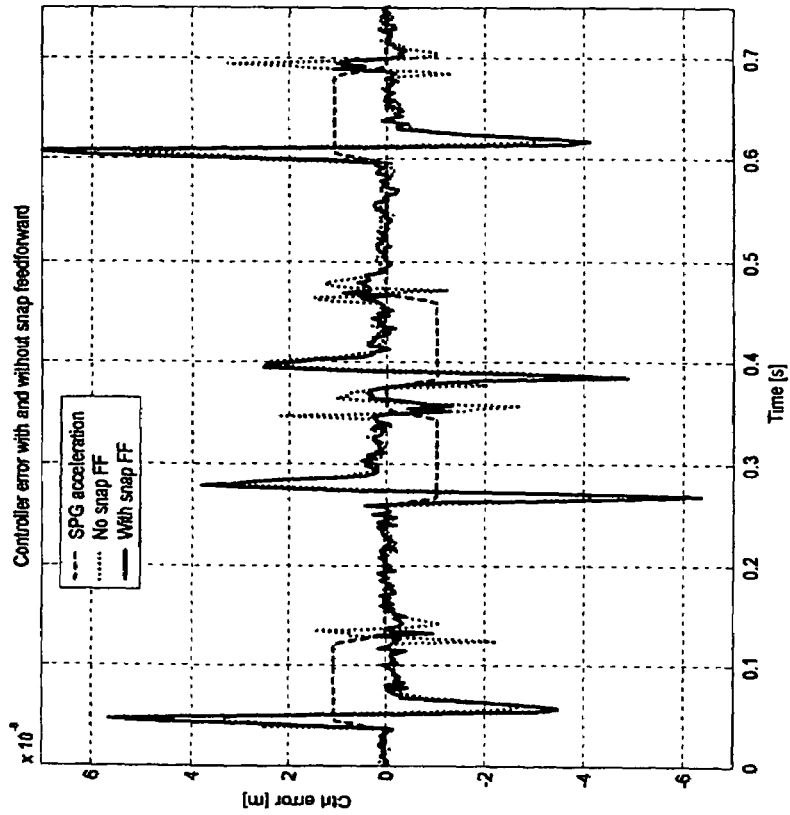
Figure 15:
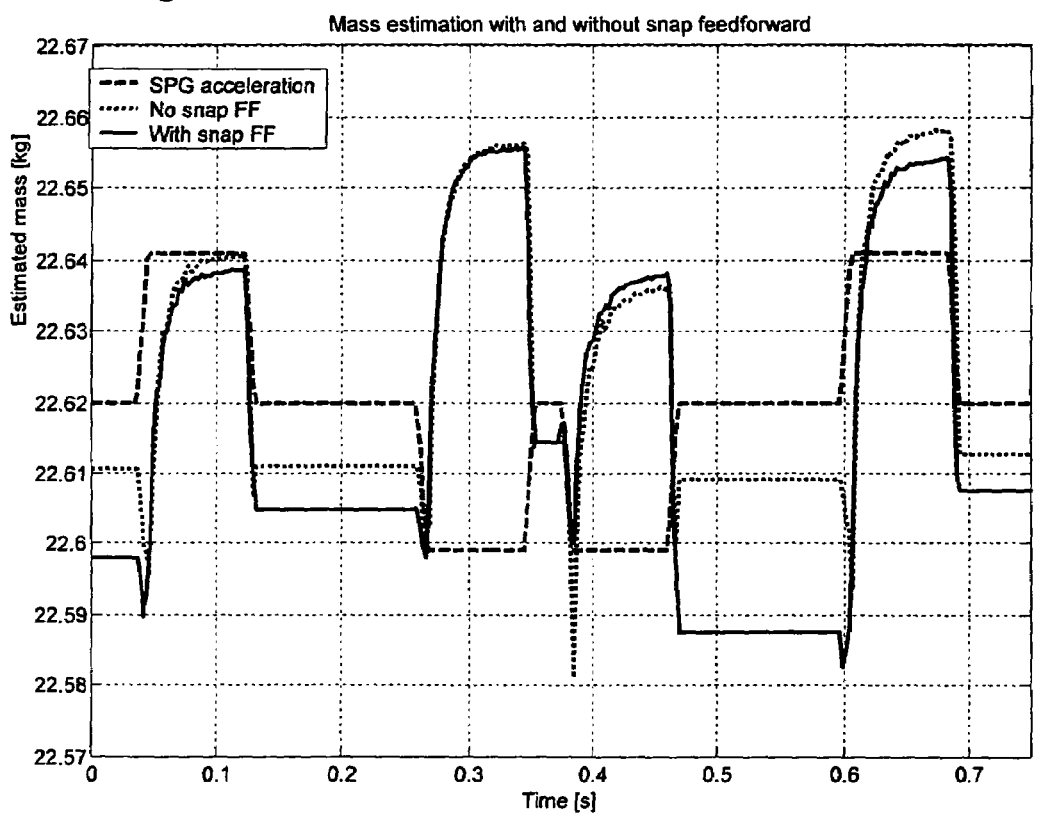
FIG. 15 shows mass estimation using 10 Hz high-pass filters, without and with snap feed-forward.

Inspecting the controller output, it was observed that the required output in standstill differed as much as 0.4 N in the extreme Y-positions. Note that the high-pass filters that should remove the offset were at a frequency of 1 Hz, while a complete move only takes about 0.32 sec. Hence, the high-pass filters may be set at a too low frequency. To test this, an experiment was performed by using a 10 Hz corner frequency for the high-pass filters, resulting in the controller errors of FIG. 14 and mass estimation of FIG. 15 (without and with snap feed-forward). Note that also a velocity feed-forward of 0.22 Ns/m was used. The plots show that at the same location, the estimator estimates a 20 g different mass, dependent on the movement direction (even when the sign of the acceleration is the same). This phenomenon is caused by nonlinear behavior of the amplifiers.

Figure 16:
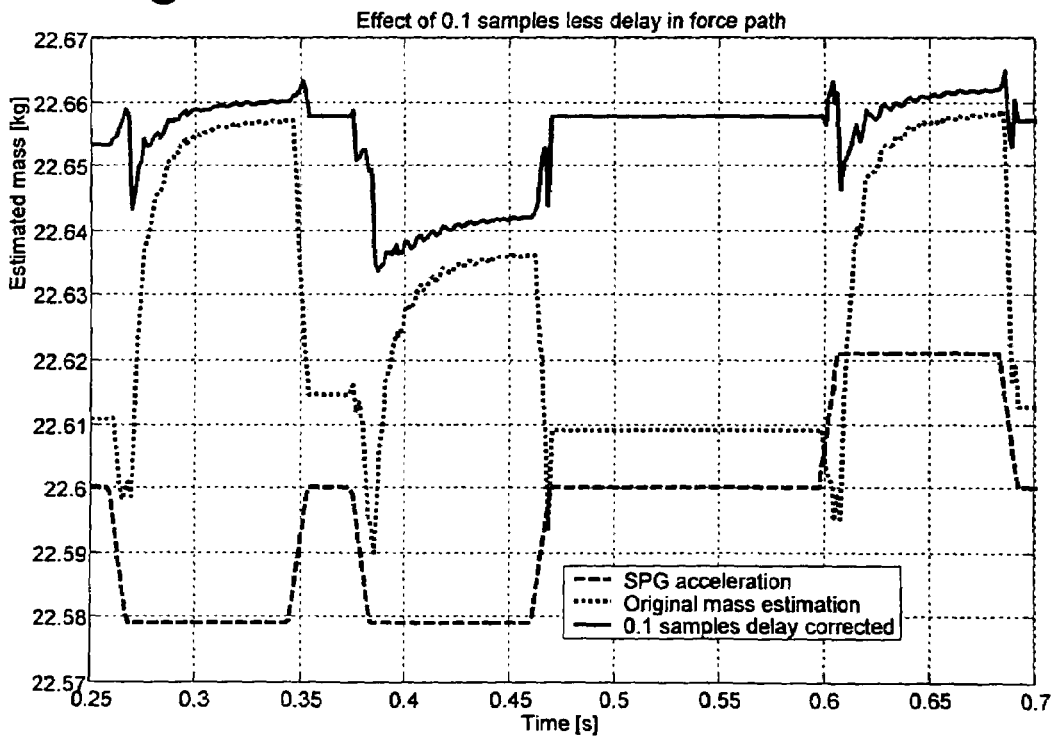
FIG. 16 shows mass estimation with 0.1 samples less delay in force path.
Figure 17:
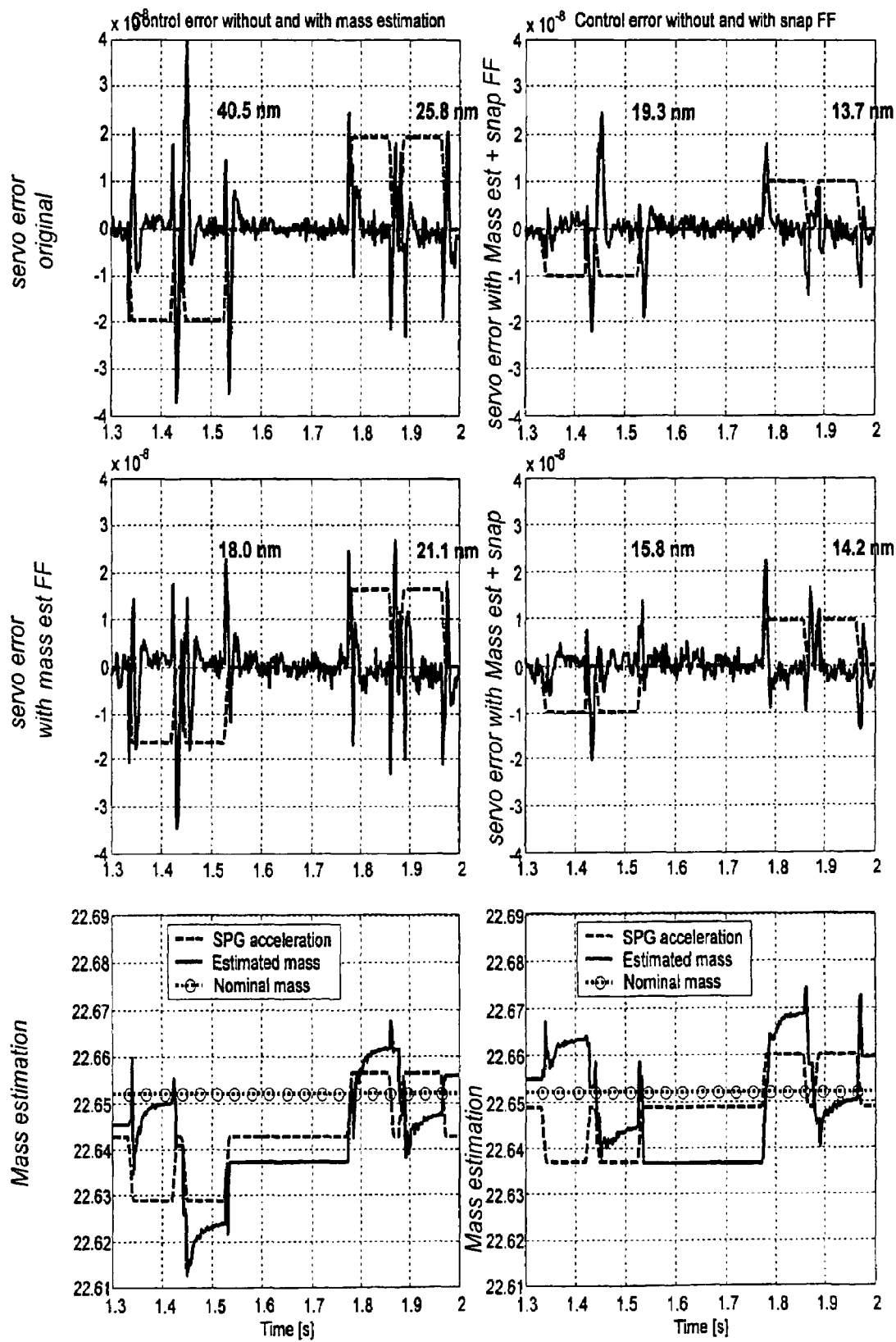
FIG. 17 shows several curves for the exposed chuck during a negative move.
Figure 18:
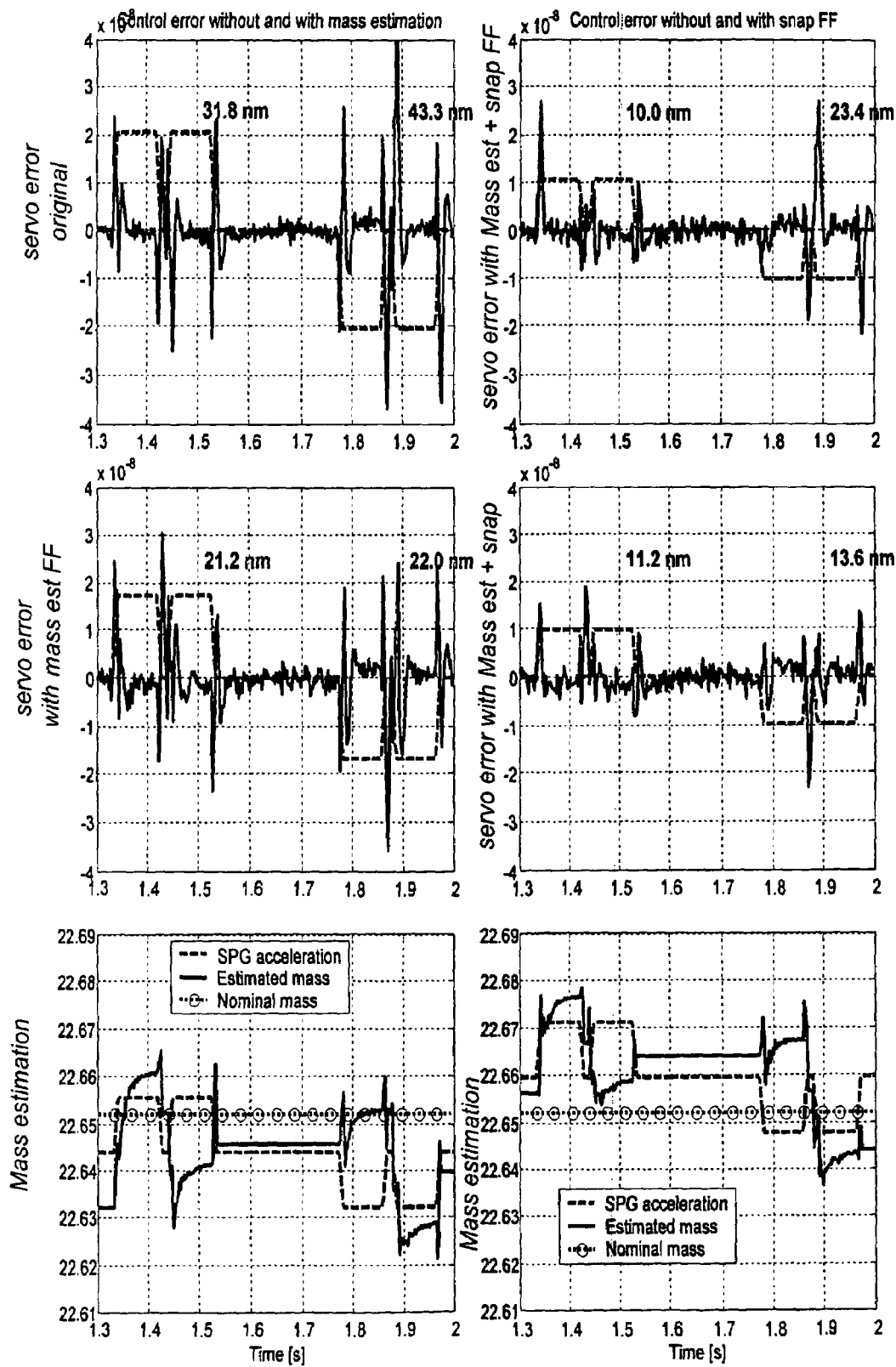
FIG. 18 shows several curves for the exposed chuck during a positive move.
Figure 19:
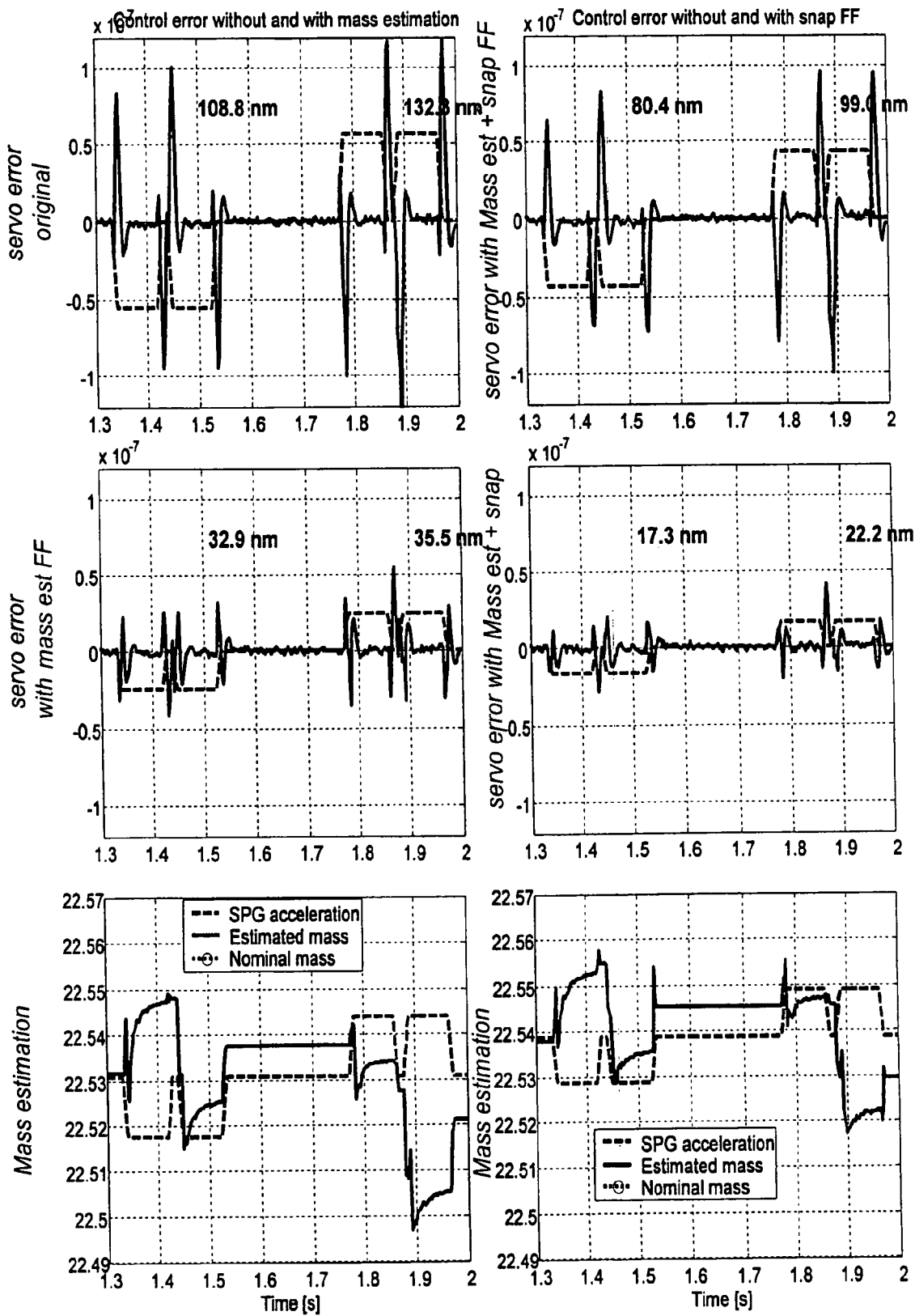
FIG. 19 shows several curves for the measure chuck during a negative move.
Figure 20:
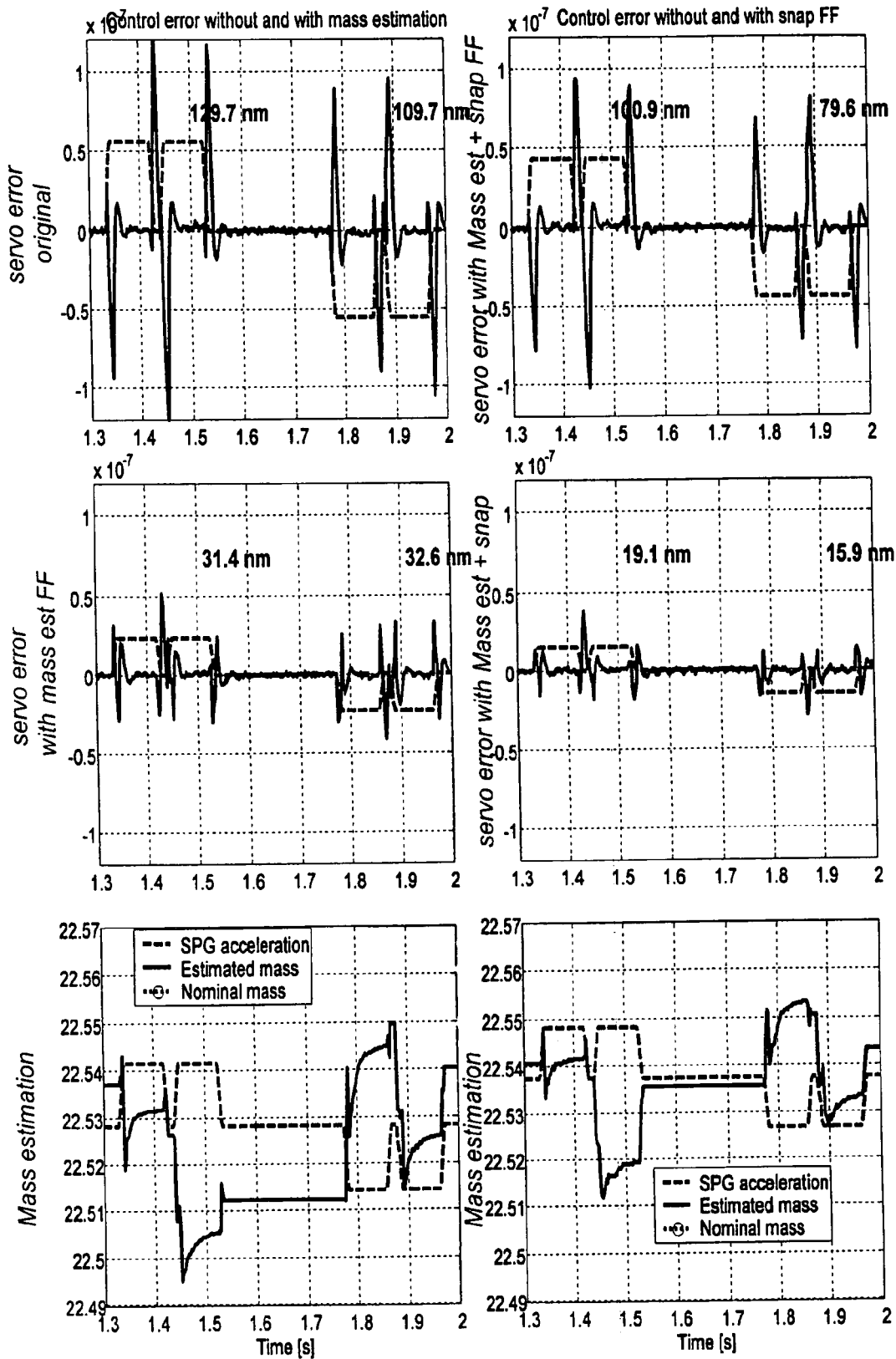
FIG. 20 shows several curves for the measure chuck during a positive move.

Although the mass estimation has now become considerably faster, it can be seen that during the jerk phase quite a large disturbance remains visible. This appears to be caused by a remaining difference in timing between the generated acceleration and force signals. By decreasing the force delay from 2.35 to 2.25 samples, the mass estimation becomes more stable, as indicated in FIG. 16.

With the knowledge gained in the previous paragraphs, a new test was performed using the following conditions:

| | |
|---|---|
| snap feed-forward gain | 3.4e−7 Ns$^3$/ms (injection after notch2) |
| snap filter frequency & damping | 700 Hz, d = 0.7 |
| snap delay correction | 400e−6 sec |
| Mass estimation high-pass filters | 10 Hz |
| Mass estimation delay in force path | 2.25 samples, force extracted before snap injection |
| Mass estimation forgetting factor | 0.995 |
| Velocity feed-forward | 0.22 Ns/m expose stage (WT), 0 Ns/m measure stage (MT) |
| Nominal mass feed-forward as calibrated earlier | expose: 22.652 kg, measure: 22.601 kg |

Combinations with and without snap feed-forward and mass estimation were performed, both on the expose stage WT and the measure stage MT. It appears that in this case at the measure stage MT the nominal feed-forward does not match very well. Each test was done 6 times: on 3 X-positions (−150 mm, 0, +150 mm), moves having both a positive and a negative direction were performed. For the centre position (X=0), the following four plots in FIGS. 17, 18, 19, and 20, respectively, show the results, including the estimated mass. In each plot, also the peak servo error after the acceleration phase is indicated. In each of the FIGS. 17, 18, 19, and 20, the top left plot shows the original situation. The middle left plot shows the effect of mass estimation, with below it the estimated mass. The top right plot shows the result with snap feed-forward only. The middle right plot shows the result with mass estimation and snap feed-forward, with below it the estimated mass.

The peak controller errors for the expose stage WT are summarized in the following tables. These are ordered according to the position in the field where the measurement was done, and because both Y=+150 and Y=−150 are present in each test file, two values are present.

TABLE 3

Peak Controller Error [Nm], Original Condition

| | X | | |
|---|---|---|---|
| Y | −150 mm | 0 | +150 mm |
| +150 mm | 43.4 | 40.5 | 35.1 |
| +150 mm | 42.6 | 43.3 | 40.7 |

TABLE 3-continued

Peak Controller Error [Nm], Original Condition

| | X | | |
|---|---|---|---|
| Y | −150 mm | 0 | +150 mm |
| −150 mm | 35.8 | 25.8 | 30.8 |
| −150 mm | 29.8 | 31.8 | 36.0 |

TABLE 4

Peak Controller Error [Nm], Mass Estimation

| | X | | |
|---|---|---|---|
| Y | −150 mm | 0 | +150 mm |
| +150 mm | 20.4 | 18.0 | 19.9 |
| +150 mm | 22.4 | 22.0 | 25.1 |
| −150 mm | 27.1 | 21.1 | 20.8 |
| −150 mm | 23.0 | 21.2 | 22.4 |

TABLE 5

Peak Controller Error [Nm], Snap Feed-Forward

| | X | | |
|---|---|---|---|
| Y | −150 mm | 0 | +150 mm |
| +150 mm | 23.0 | 19.3 | 13.0 |
| +150 mm | 20.2 | 23.4 | 12.7 |
| −150 mm | 8.7 | 13.7 | 12.0 |
| −150 mm | 11.1 | 10.0 | 12.2 |

TABLE 6

Peak Controller Error [Nm], Mass Estimation And Snap Feed-Forward

| | X | | |
|---|---|---|---|
| Y | −150 mm | 0 | +150 mm |
| +150 mm | 14.1 | 15.8 | 14.8 |
| +150 mm | 10.5 | 13.6 | 16.2 |
| −150 mm | 16.3 | 14.2 | 11.4 |
| −150 mm | 11.1 | 11.2 | 12.8 |

Regarding these experiments, the following conclusions can be drawn:

For the measure stage MT, about 60 g mismatch exists between the feed-forward mass and the estimated mass. The effect of the mass estimator is that the peak servo error decreases from more than 100 nm to about 35 nm.

At the expose stage WT, the mass estimation by itself also improves the controller error considerably (peak error decreases from 43 to 27 nm). The original error of 43 nm is relatively high due to non-exact mass calibration.

When snap feed-forward is used, the mass estimator yields a slightly less varying mass than without snap feed-forward.

When snap feed-forward is used, the peak controller error in the wafer stage field becomes more constant. The peak error decreases from 23 nm to 16 nm. Note that the snap feed-forward gain and timing was not tuned, and the estimated snap indicates a smaller value than used in the machine. Some room for improvement appears to be present.

Figure 21:
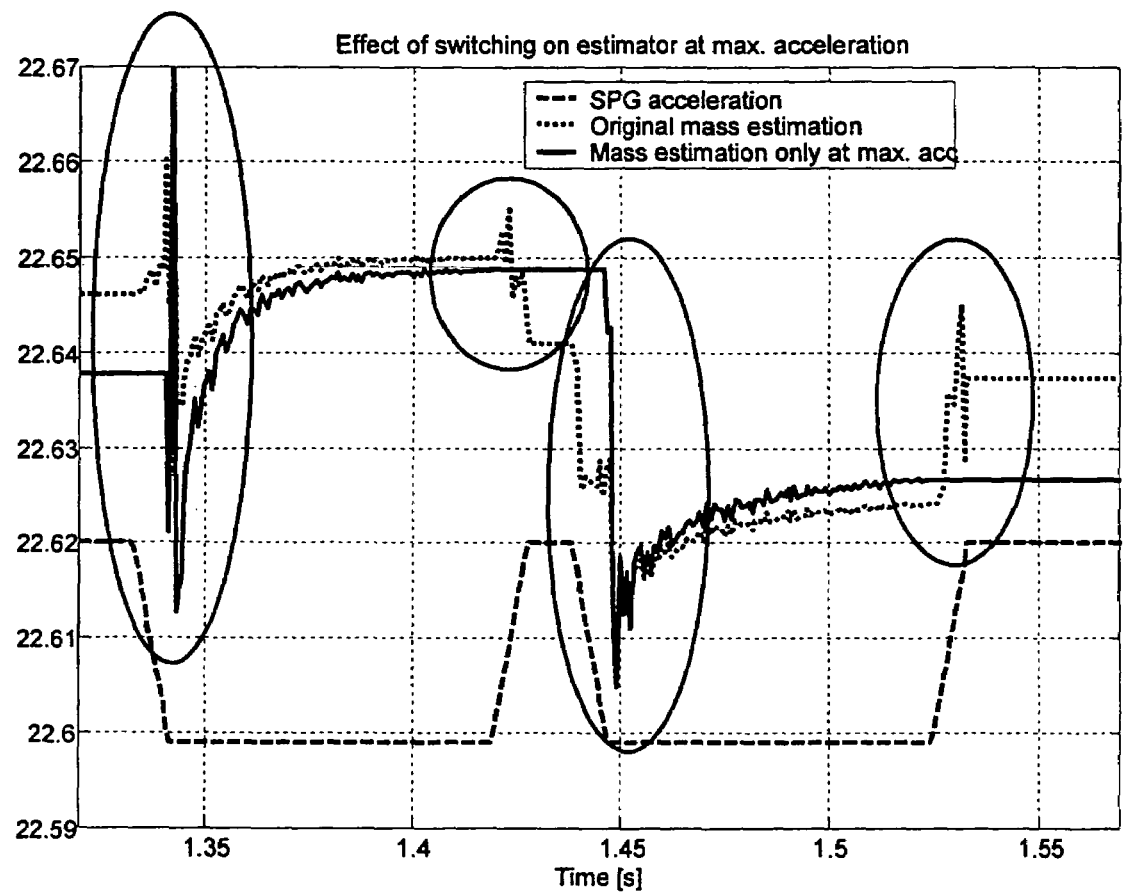
FIG. 21 shows the effect of switching on the estimator only at maximum acceleration.

During the jerk phase, the mass estimator is rapidly varying. This can be improved by switching on the estimator only when the maximum acceleration is reached (up to now, it is active whenever the acceleration is nonzero). In that case, the estimator is very constant at the end of an acceleration phase, but has to settle more during the start of the acceleration phase. This is shown in FIG. 21. The effect in the machine is tested in the following paragraph.

The same test was performed as discussed above, with the only change that the mass estimation is only active when the set point acceleration has reached its maximum. Hence, no adjustment takes place any more during the jerk phase, for the reasons mentioned above. The results summarized for the expose stage WT are listed in the tables. Table 11 summarizes results for the four combinations of snap feed-forward and mass estimation. It can be seen that the combination of snap feed-forward and mass estimation has performed slightly better than in the first test. Apparently, a constant feed-forward mass during the end of the acceleration phase improves the maximum error. In the plots, note that when using mass estimation only, the servo error is always smaller when the estimated mass is smaller than the nominal value, as observed earlier. This is no longer true if also snap feed-forward is used.

TABLE 7

Peak Controller Error [Nm], No Mass Estimation Or Snap Feed-Forward

| | X | | |
|---|---|---|---|
| Y | −150 mm | 0 | +150 mm |
| +150 mm | 28.0 | 23.9 | 17.8 |
| +150 mm | 30.6 | 18.1 | 19.7 |
| −150 mm | 13.8 | 19.3 | 17.7 |
| −150 mm | 16.1 | 20.3 | 13.3 |

TABLE 8

Peak Controller Error [Nm], Mass Estimation

| | X | | |
|---|---|---|---|
| Y | −150 mm | 0 | +150 mm |
| +150 mm | 24.1 | 20.4 | 23.4 |
| +150 mm | 25.9 | 25.4 | 24.0 |
| −150 mm | 27.9 | 25.6 | 23.0 |
| −150 mm | 25.7 | 24.3 | 24.7 |

TABLE 9

Peak Controller Error [Nm], Snap Feed-Forward

| | X | | |
|---|---|---|---|
| Y | −150 mm | 0 | +150 mm |
| +150 mm | 10.9 | 15.0 | 19.0 |
| +150 mm | 13.6 | 19.9 | 13.7 |
| −150 mm | 21.0 | 28.0 | 25.8 |
| −150 mm | 18.8 | 26.6 | 21.7 |

TABLE 10

Peak Controller Error [Nm], Mass Estimation And Snap Feed-Forward

| | X | | |
|---|---|---|---|
| Y | −150 mm | 0 | +150 mm |
| +150 mm | 11.4 | 14.1 | 11.8 |
| +150 mm | 9.9 | 13.9 | 9.7 |

TABLE 10-continued

Peak Controller Error [Nm], Mass Estimation And Snap Feed-Forward

| | X | | |
|---|---|---|---|
| Y | −150 mm | 0 | +150 mm |
| −150 mm | 13.1 | 10.4 | 10.8 |
| −150 mm | 10.9 | 10.9 | 11.1 |

TABLE 11

Peak Position Errors [Nm], Summarized

| | | Y | | |
|---|---|---|---|---|
| X | What? | −150 mm | 0 | +150 mm |
| +150 | Original | 28.0 | 23.9 | 17.8 |
| | Mass estimation | 24.1 | 20.4 | 23.4 |
| | Snap FF | 10.9 | 15.0 | 19.0 |
| | Mass est + snap FF | 11.4 | 14.1 | 11.8 |
| −150 | Original | 13.8 | 19.3 | 17.7 |
| | Mass estimation | 27.9 | 25.6 | 23.0 |
| | Snap FF | 21.0 | 28.0 | 25.8 |
| | Mass est + snap FF | 13.1 | 10.4 | 10.8 |

Fourth Embodiment

An alternative implementation was developed for the case when only 1 parameter is estimated, as is true in the case of mass estimation.

In the case of mass estimation, the non-recursive least-squares method attempts to find the optimal estimated mass $\hat{m}$ in the equation:

$$\begin{bmatrix} a_1 \\ a_2 \\ \vdots \\ a_n \end{bmatrix} \hat{m} = \begin{bmatrix} f_1 \\ f_2 \\ \vdots \\ f_n \end{bmatrix}$$

$$A\hat{m} = F$$

Here, $a_i$ (i=1, 2, ..., n) is an acceleration sample ($a_n$ is the most recent sample), while $f_i$ (i=1, 2, ..., n) is a control force sample ($f_n$ being the most recent one). This can be written into:

$$A^T A \hat{m} = A^T F$$

$$\hat{m} \sum_{i=1}^{n} (a_i)^2 = \sum_{i=1}^{n} (a_i \cdot f_i)$$

$$\hat{m} = \frac{\sum_{i=1}^{n} (a_i \cdot f_i)}{\sum_{i=1}^{n} (a_i)^2}$$

Figure 22:
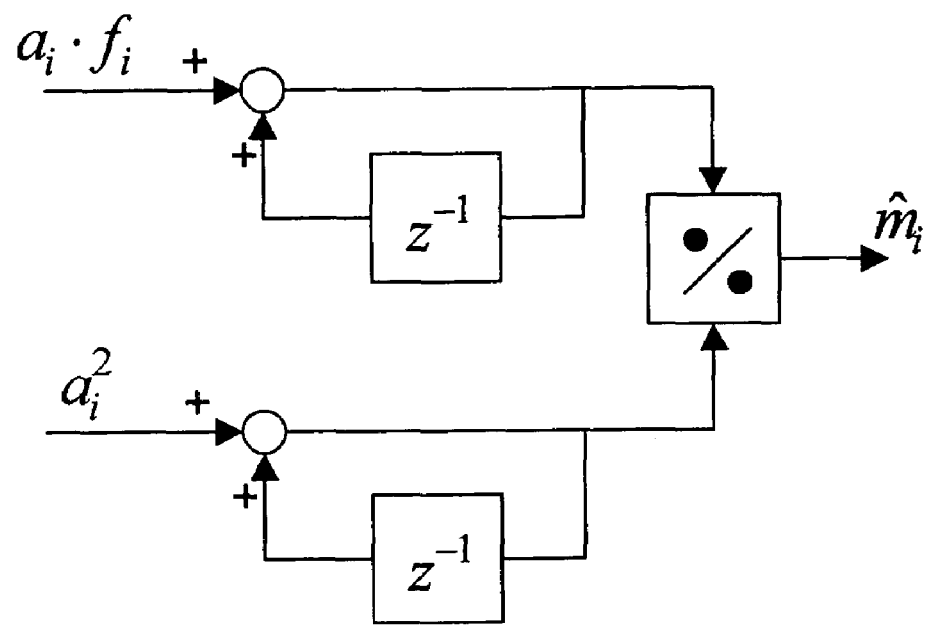
FIG. 22 shows an alternative least-square estimation for 1 parameter.

Hence, the least-squares estimate can be found by the filter implementation shown in FIG. 22.

This form does not support using a forgetting factor $\lambda$ yet. Implementing this factor can be done as follows:

$$\hat{m} \sum_{i=1}^{n} \lambda^{n-i} (a_i)^2 = \sum_{i=1}^{n} \lambda^{n-i} (a_i \cdot f_i)$$

$$\hat{m} = \frac{\sum_{i=1}^{n} \lambda^{n-i} (a_i \cdot f_i)}{\sum_{i=1}^{n} \lambda^{n-i} (a_i)^2}$$

Figure 23:
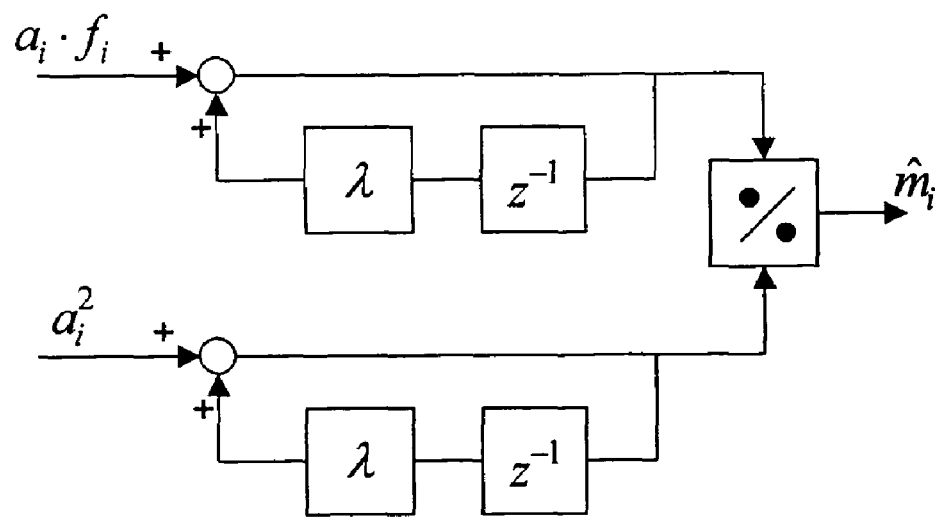
FIG. 23 shows an alternative least-square estimation for 1 parameter with forgetting factor.

The matching filter implementation then looks like that in FIG. 23. This alternative implementation has a simpler form than the original least-squares implementation, which involved two recursion equations.

In the case of offset estimation, the used model would look like:

$$F = \hat{m}a + \hat{d}$$

where: $\hat{d}$=estimated offset.

Figure 24:
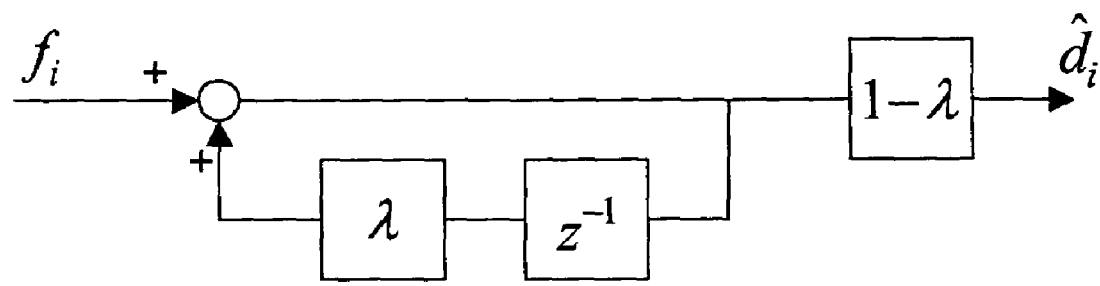
FIG. 24 shows a simplified offset estimation scheme.

When the offset is estimated by itself (not simultaneous with the mass), effectively a signal vector is used which is a constant of 1. Using the structure of FIG. 23, $a_i$ is replaced by 1. The top filter is then fed with the control force, while the bottom filter is fed by an input of 1. It can be easily calculated that the bottom filter settles to a value of $1/(1-\lambda)$. This fixed value can then be used instead of the output of the bottom filter, yielding the structure of FIG. 24.

Fifth Embodiment

In the embodiments discussed above, the one and only estimated parameter that was used in the feed-forward, was the mass. This mass actually serves as the simplest form of 'inverse process dynamics': it is the inverse of the transfer from force to acceleration. The additional snap feed-forward actually serves as a better 'inverse process dynamics' by including one (zero-damping) resonance.

An alternative feed-forward would be a higher-order model of the inverse process. One way to do this is to estimate a model of the process, inverse this model, and use this inverse model as a filter in the acceleration feed-forward path. This method, however, has some drawbacks. First, the process usually has a high order of gain roll-off for higher frequencies, which translates into a strongly rising frequency characteristic of the process inverse. Furthermore, non-minimum phase zero's in the process transfer function translate into unstable poles in the inverse. This especially poses a problem in the discrete domain, where non-minimum phase zero's are common.

The solution proposed here is to extend the mass estimator to an 'inverse process dynamics' estimator. The estimator then estimates the transfer function from measured acceleration to the applied force, rather than estimating the transfer function from the applied force to the acceleration, and inverting this estimated transfer function. This way, a transfer function estimate of the inverse dynamics will result that is optimal in a least-squares sense. By choosing, for example, a FIR filter architecture, stability of the estimate is guaranteed.

Figure 33:
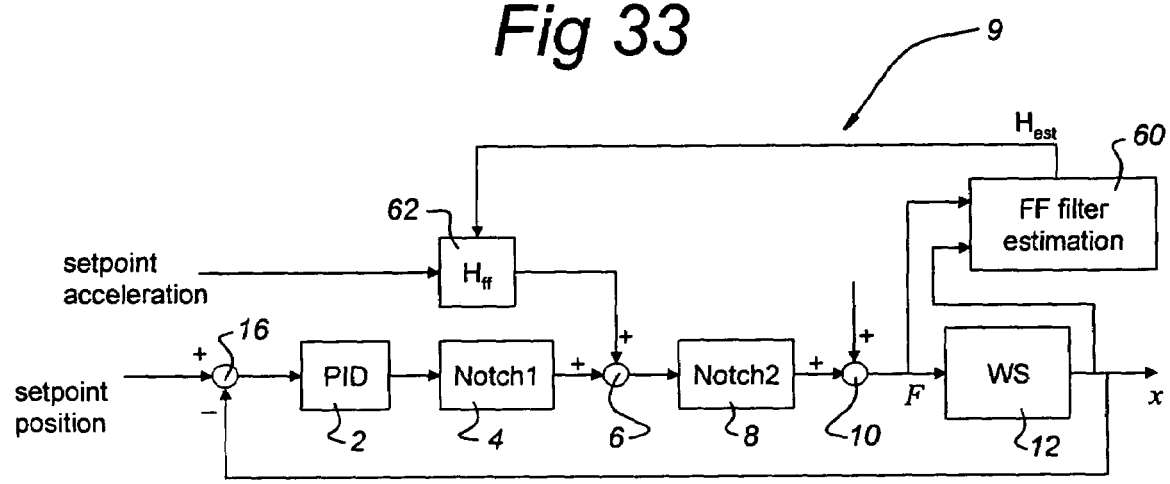
FIG. 33 shows a circuit architecture with on-line feed-forward estimation.

FIG. 33 shows the basic architecture for this alternative approach. The architecture is similar to the one shown in FIG. 3, and like reference numbers refer to the same components. However, the mass estimation unit 18 of FIG. 3 has being generalised into a feed-forward (FF) filter estimation unit 60. Moreover, the multiplier 14 of FIG. 3 has been changed into a transfer function unit 62, arranged to apply a transfer function $H_{ff}$ to the set point acceleration.

The difference between the architectures of FIGS. 3 and 33 is that no longer a mass is estimated but the relation between acceleration and force. As may be evident to a person skilled in the art, if the wafer stage 12 (or any other mass to be controlled) performs as a "rigid body", then the architecture of FIG. 30 reduces to the one of FIG. 3 since then the transfer function $H_{ff}$ is the same as multiplying by mass $m_{ff}$. The difference between the two architectures is important when there are dynamics in the wafer stage 12.

The feed-forward filter estimation unit 60 determines an estimated transfer function $H_{est}$ from the measured acceleration to the applied force F. In the transfer function unit 62 this estimated transfer function $H_{est}$ is used, together with the set point acceleration to provide an estimated input force. This estimated input force is deducted from the real input force and the difference is used by the least square's mechanism to produce a new estimated transfer function.

Figure 25:
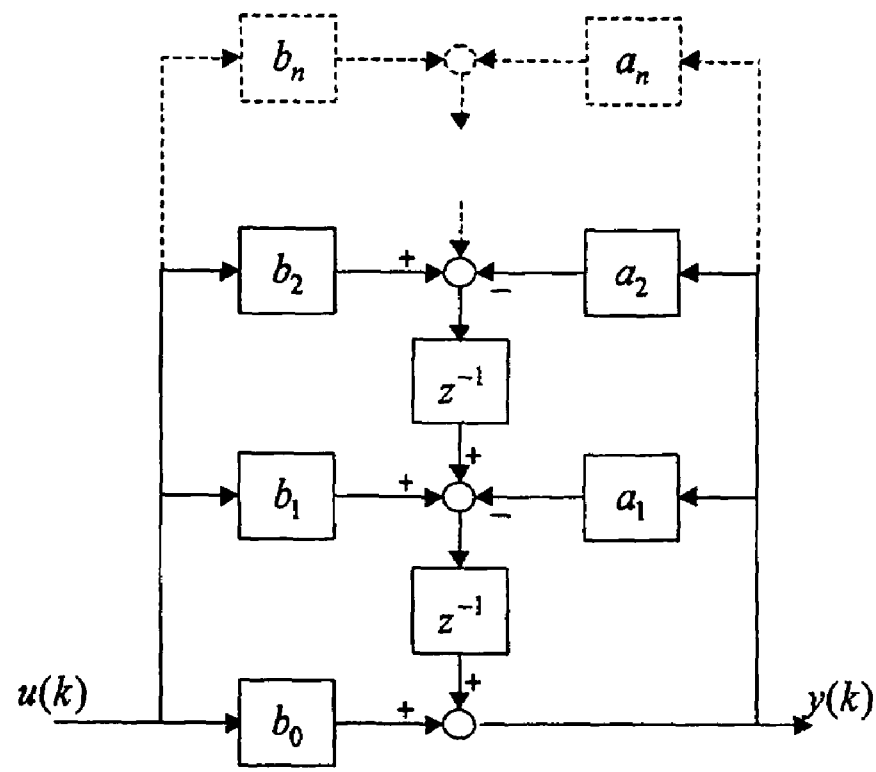
FIG. 25 shows an ARX filter structure for a simplified implementation to find the optimal estimation mass.

The most general structure of such an inverse process dynamics estimator that can be used is the ARX structure, as shown in FIG. 25.

In general terms, the transfer function of this structure is:

$$y(k) = -a_1 y(k-1) - a_2 y(k-2) - \ldots - a_n y(k-n) + +b_0 u(k) + b_1 u(k-1) + \ldots + b_m u(k-m)$$

Hence, the signal vector $\omega(k)$ and parameter vector $\hat{\theta}(k)$ are defined by:

$$\omega(k) = [-y(k-1), -y(k-2), \ldots, -y(k-n), u(k), u(k-1), \ldots, u(k-m)]$$

$$\hat{\theta}(k) = [\hat{a}_1(k), \hat{a}_2(k), \ldots, \hat{a}_n(k), \hat{b}_0(k), \hat{b}_1(k), \ldots, \hat{b}_m(k)]$$

Here, the input u is formed by the measured acceleration. The output y then represents the estimated input force, which is compared with the real input force to create the estimation error.

Figure 26:
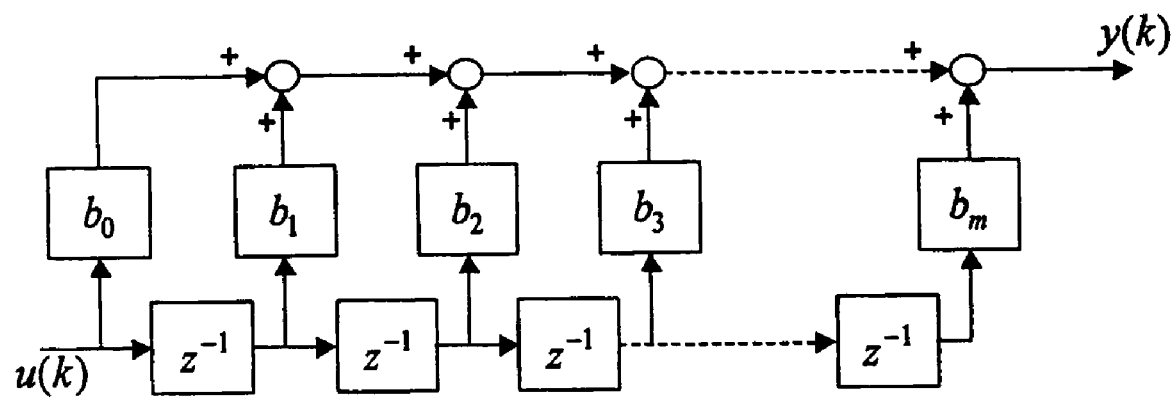
FIG. 26 shows a FIR filter architecture taking a forgetting factor into account.

Another architecture that can be used is a FIR filter. The advantage of the FIR filter is that it cannot become unstable. The architecture is shown in FIG. 26.

The FIR filter recursion equation is:

$$y(k) = b_0 u(k) + b_1 u(k-1) + \ldots + b_m u(k-m)$$

Consequently, the definition of the signal vector and parameter vector are:

$$\omega(k) = [u(k), u(k-1), \ldots, u(k-m)]$$

$$\hat{\theta}(k) = [\hat{b}_0(k), \hat{b}_1(k), \ldots, \hat{b}_m(k)]$$

Again, the input u(k) is formed by the measured acceleration and the filter output y(k) represents the estimated input force, used to create the estimation error by subtracting it from the actual input force.

Figure 27:
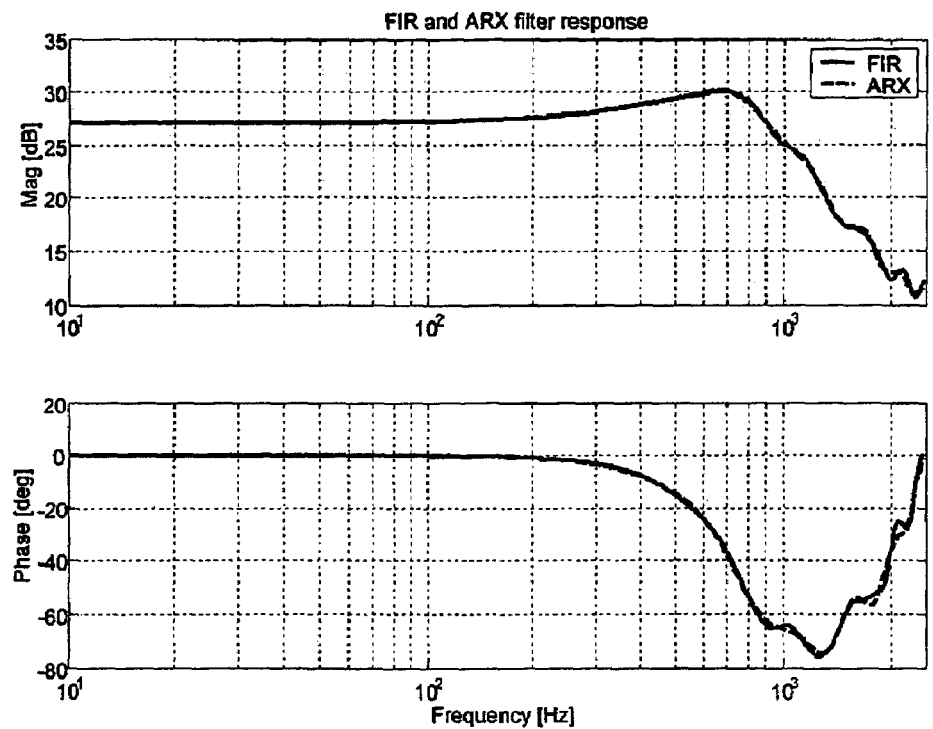
FIG. 27 shows the magnitude and phase of an estimated transfer function in an alternative approach; the situation is shown for both a FIR filter and an ARX filter.
Figure 28:
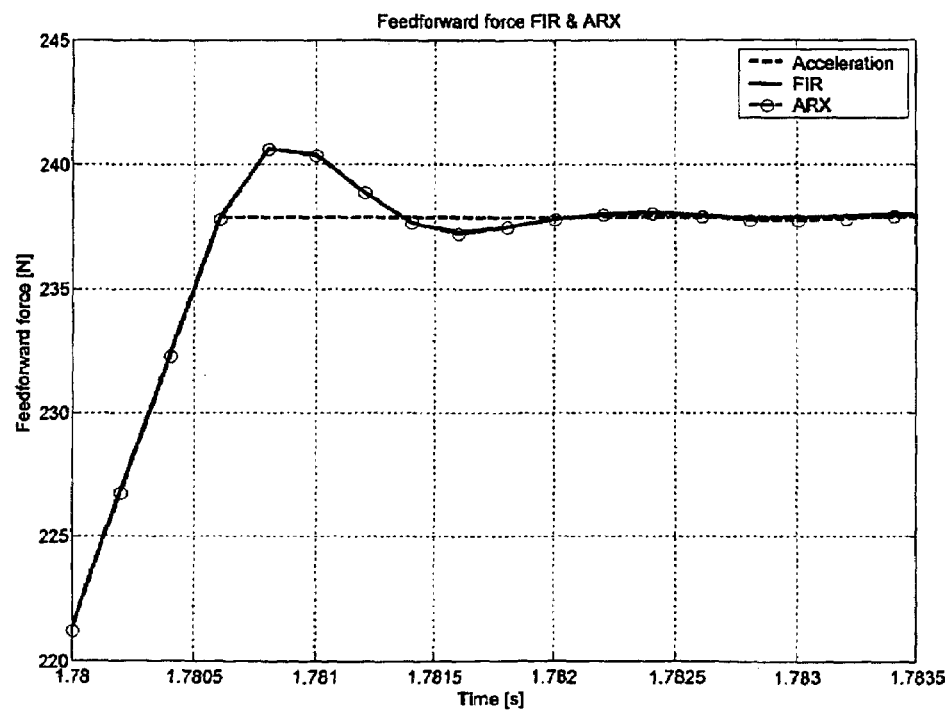
FIG. 28 shows the feed-forward for the FIR and ARX filters used in FIG. 27.
Figure 29:
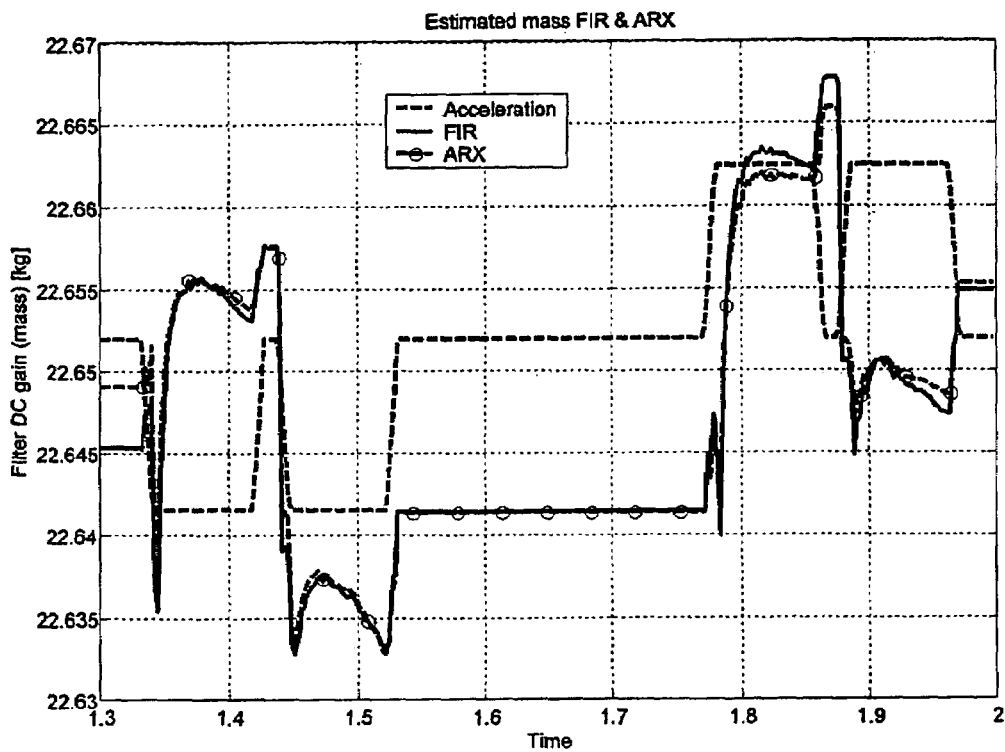
FIG. 29 shows the estimated mass for the situation corresponding with FIGS. 27 and 29.
Figure 30:
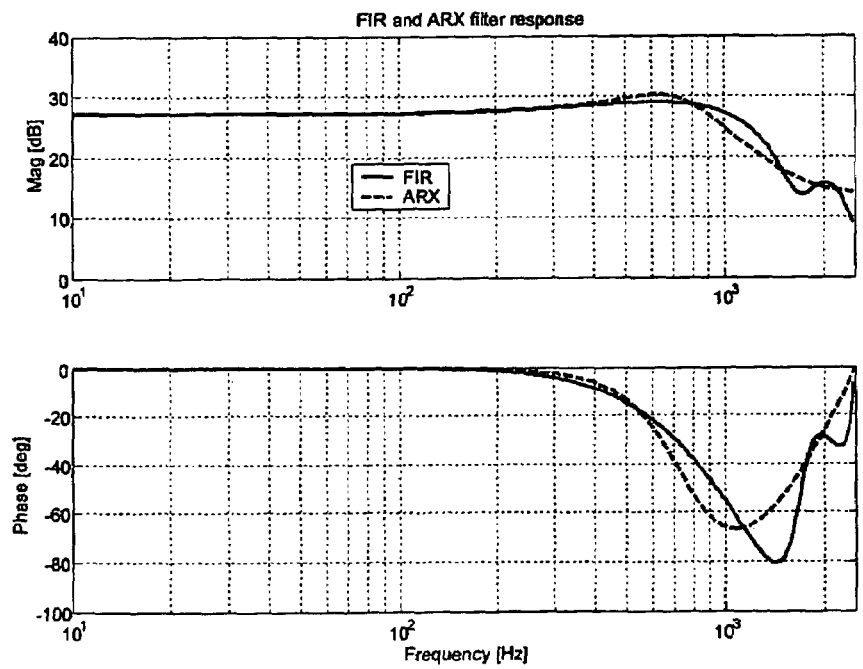
FIGS. 30, 31 and 32 are showing curves which are similar as the curves in FIGS. 27, 28 and 29, respectively, be it that the filters used are of a much lower order.
Figure 31:
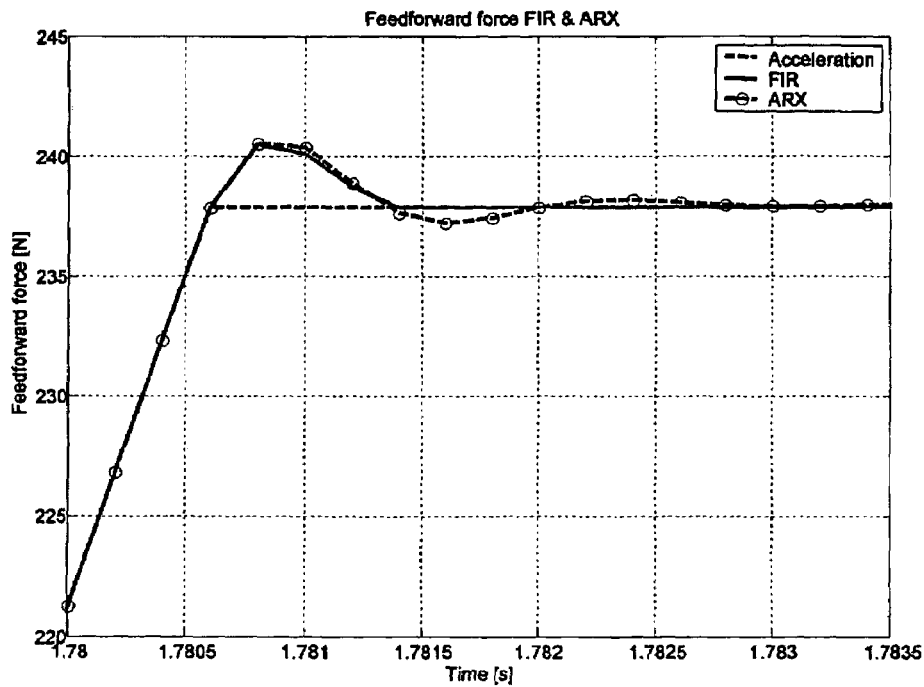
Figure 32:
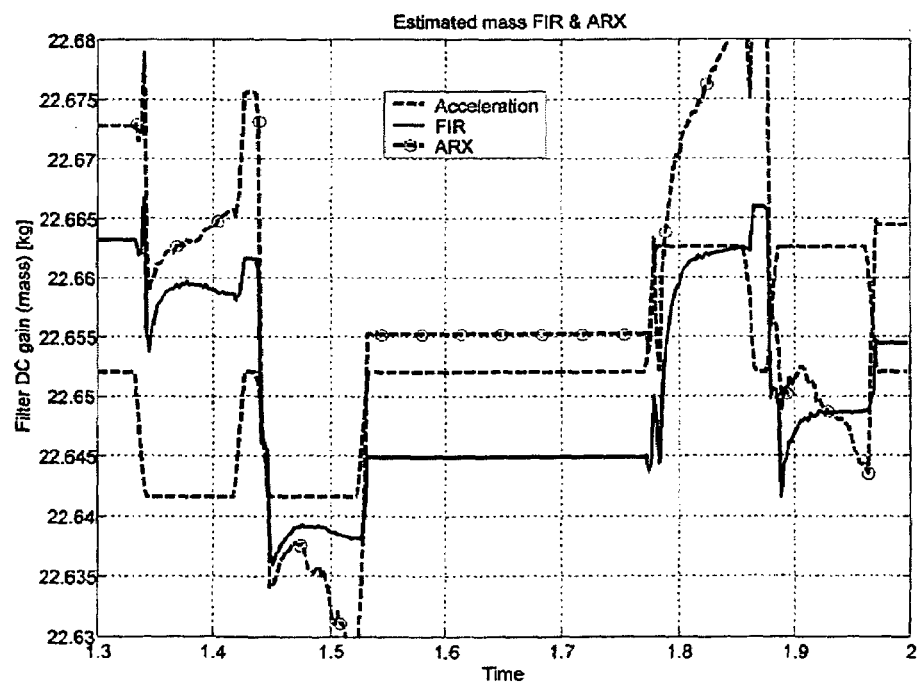

FIG. 27 shows the estimated transfer function for a large number of estimated parameters for both the FIR and the ARX filter. The FIR filter has 20 FIR taps (21 parameters), whereas the ARX filter is of the 10th order (21 parameters). The resemblance between the FIR and ARX transfer functions is striking. FIG. 28 shows the resulting feed-forward force for both filters. The "overshoot" shows a striking resemblance with snap feed-forward. FIG. 29 shows the estimated mass, which equals the DC gain of each of the resulting filters. FIG. 30 and FIG. 31 show the results for a much lower filter order. FIG. 30 shows estimated transfer functions for a FIR filter with 4 taps (5 parameters) and a 2nd order ARX filter (5 parameters), respectively. FIG. 31 shows the feed-forward force in both situations. The resulting feed-forward is not very different from the one associated with FIGS. 27-29 but the resulting estimated mass, shown in FIG. 32, now has become much less stable in the ARX case.

What is claimed is:

1. A control system that controls a position of a mass by applying a control force to said mass in accordance with a desired mass acceleration, said control system comprising:
   a first input that receives a signal based on a desired position of said mass;
   a second input that receives a feedback signal indicative of an actual position of said mass;
   a comparator unit configured to determine a signal indicative of a difference between said desired mass position and said actual mass position;
   a control unit configured to produce a signal indicative of said control force based on said signal indicative of the difference between said desired mass position and said actual mass position;
   an estimator unit configured to calculate an estimated relation between said signal indicative of said control force and status information of said mass and generate an estimated mass signal, said status information comprising an indication of at least one of a position of said mass, a velocity of said mass, and an acceleration of said mass; and
   a third input that receives a feed-forward signal indicative of said desired mass acceleration, as modified by said estimated mass signal, and adds the feed-forward signal to the signal indicative of said control force to determine the control force that achieves the desired mass acceleration.

2. The control system of claim 1, wherein said estimator unit calculates said estimated relation in accordance with a least-squares method.

3. The control system of claim 2, wherein said control system is configured to remove an offset of said control force.

4. The control system of claim 3, wherein further comprising a high-pass filter to remove said control force offset.

5. The control system of claim 1, wherein said estimated relation comprises an estimated mass.

6. The control system of claim 5, wherein said estimator unit calculates said estimated mass by:

$$\hat{m} = \frac{\sum_{i=1}^{n} \lambda^{n-i}(a_i \cdot f_i)}{\sum_{i=1}^{n} \lambda^{n-i}(a_i)^2}$$

where:
$\hat{m}$ = estimated mass
$a_i$ (i=1, 2, 3, 4, ..., n) is an acceleration sample.
$f_i$ (i=1, 2, 3, 4, ..., n) is a control force sample.
$\lambda$ is a forgetting factor.

7. The control system of claim 6, wherein said control system is configured to calculate at least one of an estimated velocity coefficient, an estimated jerk coefficient, and an estimated snap coefficient from said feedback position signal.

8. The control system of claim 7, wherein said at least one of said estimated velocity coefficient, said estimated jerk coefficient, and said estimated snap coefficient are used to determine said control force.

9. The control system of claim 1, wherein said estimated relation comprises estimated filter coefficients that characterize said mass acceleration and said control force.

10. The control system of claim 9, further including a transfer function unit that characterizes said desired mass acceleration.

11. A method of controlling a position of a mass by applying a control force to said mass in accordance with a desired mass acceleration, said method comprising:
   determining information indicative of a difference between a desired mass position and an actual mass position;
   producing information indicative of said control force based on said information indicative of the difference between said desired mass position and said actual mass position;
   obtaining status information of said mass indicative of at least one of said position of said mass, a velocity of said mass, and an acceleration of said mass;
   calculating an estimated relation between said control force and said mass status information and generating estimated mass information;
   providing feed-forward information indicative of said desired mass acceleration and modifying the feed forward information with the estimated mass information;
   adding the modified feed-forward information to the control force information to determine the control force to achieve the desired mass acceleration.

12. The method of claim 11, wherein said estimated relation is calculated in accordance with a least-squares method.

13. The method of claim 12, wherein said estimated relation comprises an estimated mass.

14. The method of claim 13, wherein said estimated mass is calculated in accordance with:

$$\hat{m} = \frac{\sum_{i=1}^{n} \lambda^{n-i}(a_i \cdot f_i)}{\sum_{i=1}^{n} \lambda^{n-i}(a_i)^2}$$

where:
   $\hat{m}$ = estimated mass
   $a_1$ (i=1, 2, 3, 4, . . . , n) is an acceleration sample.
   $f_i$ (i=1, 2, 3, 4, . . . , n) is a control force sample.
   $\lambda$ is a forgetting factor.

15. The method of claim 11, further including removing an offset of said control force.

16. The method of claim 11, further including calculating at least one of an estimated velocity coefficient, an estimated jerk coefficient, and an estimated snap coefficient from said feedback position signal.

17. The method of claim 11, wherein said estimated relation comprises calculating estimated filter coefficients that characterize said mass acceleration and said control force.

18. The method of claim 17, further including characterizing said desired mass acceleration based on a corresponding transfer function.

* * * * *